(12) United States Patent
Kim et al.

(10) Patent No.: US 7,309,922 B2
(45) Date of Patent: Dec. 18, 2007

(54) LOWER SUBSTRATE, DISPLAY APPARATUS HAVING THE SAME AND METHOD OF MANUFACTURING THE SAME

(75) Inventors: Hyun-Young Kim, Seoul (KR); Joo-Sun Yoon, Seoul (KR); Bong-Ju Kim, Suwon-si (KR); Seung-Gyu Tae, Suwon-si (KR)

(73) Assignee: Samsun Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/968,825

(22) Filed: Oct. 19, 2004

(65) Prior Publication Data
US 2005/0104070 A1    May 19, 2005

(30) Foreign Application Priority Data
Oct. 20, 2003  (KR) ............... 10-2003-0072907
Nov. 3, 2003   (KR) ............... 10-2003-0077222
Nov. 6, 2003   (KR) ............... 10-2003-0078191

(51) Int. Cl.
    H01L 29/40    (2006.01)
(52) U.S. Cl. ............ 257/774; 257/776; 257/59; 257/72
(58) Field of Classification Search ........... 257/774, 257/775, 776, 59, 72, E23.019
    See application file for complete search history.

(56) References Cited

U.S. PATENT DOCUMENTS 5,014,104 A * 5/1991  Ema ............... 257/371
5,060,045 A * 10/1991 Owada et al. ....... 257/211
5,966,190 A * 10/1999 Dohjo et al. ........ 349/39
6,043,859 A *  3/2000 Maeda ............. 349/143

FOREIGN PATENT DOCUMENTS

KR    1020030008981    1/2003

OTHER PUBLICATIONS

English Abstract for Publication No.: 1020030008981.

* cited by examiner

*Primary Examiner*—Sara Crane
(74) *Attorney, Agent, or Firm*—F. Chau & Associates, LLC

(57) ABSTRACT

In a lower substrate, a display apparatus having the lower substrate and a method of manufacturing the lower substrate, the lower substrate includes a pixel area and a circuit area. An image is displayed in the pixel area. A first signal electrode is disposed in a circuit area. A first insulating layer includes an opening, through which the first signal electrode is exposed. A second signal electrode is disposed on the first insulating layer in the circuit area, and spaced apart from the first signal electrode. A second insulating layer is disposed on the first insulating layer, and includes a contact hole, through which the first and second signal electrodes are exposed. A conductive layer electrically connects the first signal electrode to the second signal electrode. Therefore, a manufacturing process is simplified so that a yield of the lower substrate is increased.

10 Claims, 28 Drawing Sheets

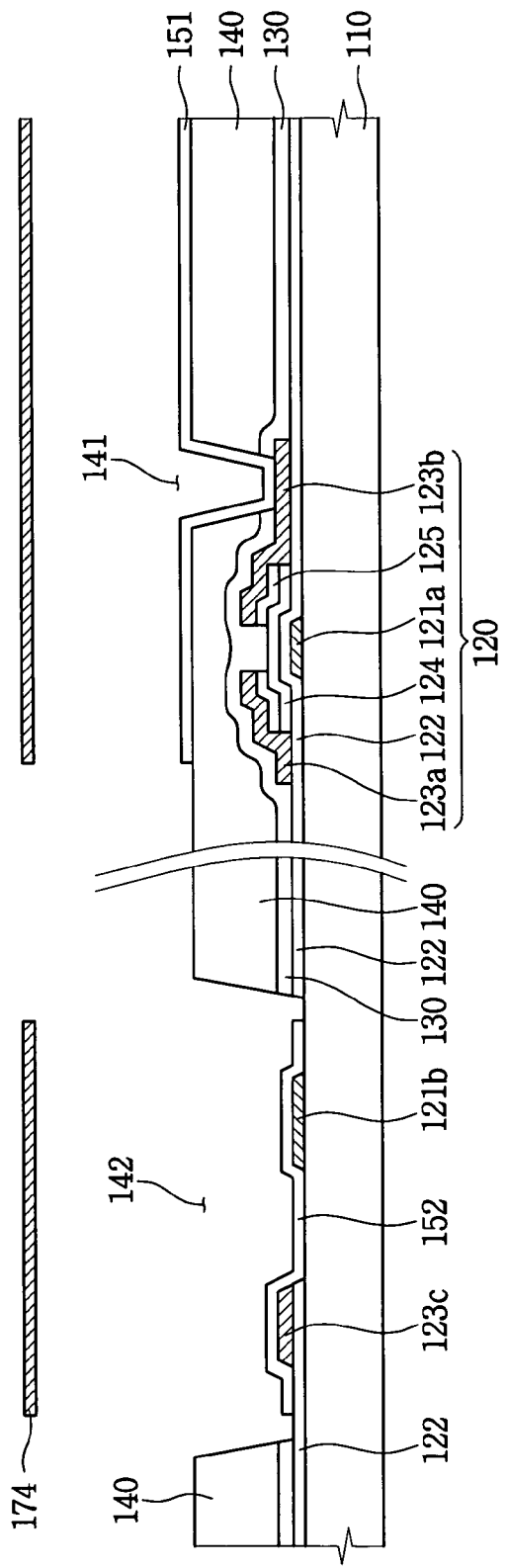

LOWER SUBSTRATE, DISPLAY APPARATUS HAVING THE SAME AND METHOD OF MANUFACTURING THE SAME

CROSS-REFERENCE OF RELATED APPLICATIONS

The present application claims priority from Korean Patent Application No. 2003-72907, filed on Oct. 20, 2003, Korean Patent Application No. 2003-77222, filed on Nov. 3, 2003 and Korean Patent Application No. 2003-78191, filed on Nov. 6, 2003, the disclosure of which is hereby incorporated herein by reference in their entireties.

BACKGROUND OF THE INVENTION

1. Field of the Invention

The present invention relates to a lower substrate, a display apparatus having the lower substrate and a method of manufacturing the lower substrate. More particularly, the present invention relates to a lower substrate capable of improving a yield, a display apparatus having the lower substrate and a method of manufacturing the lower substrate.

2. Description of the Related Art

Generally, a conventional liquid crystal display (LCD) apparatus includes a lower substrate, an upper substrate and a liquid crystal layer interposed between the lower and upper substrates.

The lower substrate includes a display region and a peripheral region adjacent to the display region. A plurality of pixels is disposed in the display region, and the pixels are arranged in a matrix shape. Each of the pixels includes a gate line, a data line, a thin film transistor (TFT) and a pixel electrode. The TFT is electrically connected to the pixel electrode and the gate and data lines.

A gate driving integrated circuit (IC) that applies a driving voltage to the gate line is formed in a peripheral region. The gate driving IC is formed on a same layer as the TFT. When the gate driving IC is formed on the lower substrate together with the TFT, volume and size of the LCD apparatus may be decreased.

However, the gate driving IC may be defected during the manufacturing process, and a parasitic capacitance may be formed between the gate driving IC and the upper substrate so that a yield of the lower substrate is decreased.

BRIEF SUMMARY OF THE INVENTION

The present invention provides a lower substrate capable of improving a yield.

The present invention also provides a display apparatus having the above-mentioned lower substrate.

The present invention also provides a method of manufacturing the above-mentioned lower substrate.

A lower substrate in accordance with a feature of the present invention includes a pixel area and a circuit area. An image is displayed in the pixel area.

A first signal electrode is disposed in the circuit area. The first signal electrode is exposed through an opening of a first insulating layer. A second signal electrode is disposed on the first insulating layer in the circuit area, and spaced apart from the first signal electrode. A second insulating layer is disposed on the first insulating layer, and includes a contact hole. The first and second signal electrodes are exposed through the contact hole. A conductive layer electrically connects the first signal electrode to the second signal electrode.

A lower substrate in accordance with another feature of the present invention includes a pixel area and a circuit area. An image is displayed in the pixel area.

A first signal electrode is disposed in the circuit area. The first signal electrode is exposed through an opening of a first insulating layer. A second signal electrode is disposed on the first insulating layer in the circuit area, and spaced apart from the first signal electrode. A second insulating layer is disposed on the first insulating layer, and includes a first contact hole. The first and second signal electrodes are exposed through the first contact hole. A third insulating layer is disposed on the second insulating layer, and includes a second contact hole. The second insulating layer adjacent to the first contact hole and the first and second signal electrodes are exposed through the second contact hole. A conductive layer electrically connects the first signal electrode to the second signal electrode through the first and second contact holes.

A display apparatus in accordance with a feature of the present invention includes a lower substrate and an upper substrate corresponding to the lower substrate.

The lower substrate includes a first signal electrode disposed in a circuit area, a first insulating layer having an opening, a second signal electrode disposed on the first insulating layer in the circuit area and spaced apart from the first signal electrode, a second insulating layer disposed on the first insulating layer to include a contact hole, and a conductive layer electrically connecting the first signal electrode to the second signal electrode through the contact hole. The first signal electrode is exposed through the opening of the first insulating layer. The first and second signal electrodes are exposed through the contact hole.

A display apparatus in accordance with another feature of the present invention includes a lower substrate and an upper substrate corresponding to the lower substrate.

The lower substrate includes a first signal electrode disposed in a circuit area, a first insulating layer having an opening, a second signal electrode disposed on the first insulating layer in the circuit area and spaced apart from the first signal electrode, a second insulating layer disposed on the first insulating layer to include a first contact hole, a third insulating layer disposed on the second insulating layer to include a second contact hole, and a conductive layer electrically connecting the first signal electrode to the second signal electrode through the first and second contact holes. The first signal electrode is exposed through the opening of the first insulating layer. The first and second signal electrodes are exposed through the first contact hole of the first insulating layer. The second insulating layer adjacent to the first contact hole and the first and second signal electrodes are exposed through the second contact hole.

A method of manufacturing a lower substrate in accordance with a feature of the present invention is provided as follows. The lower substrate includes a pixel area and a circuit area.

A first signal electrode is formed in the circuit area. A first insulating layer is formed in the circuit area having the first signal electrode. A second signal electrode is formed on the first insulating layer. The second signal electrode is spaced apart from the first signal electrode. A second insulating layer is formed in the circuit area having the first insulating layer and the second signal electrode. The first and second insulating layers are patterned to form a contact hole. The first and second signal lines are exposed through the contact hole. A conductive layer electrically connecting the first signal electrode to the second signal electrode is formed.

A method of manufacturing a lower substrate in accordance with another feature of the present invention is provided as follows. The lower substrate includes a pixel area and a circuit area.

A first signal electrode is formed in a circuit area. A first insulating layer is formed in the circuit area having the first signal electrode. A second signal electrode is formed on the first insulating layer. The second signal electrode is spaced apart from the first signal electrode. A second insulating layer is formed on the first insulating layer and the second signal electrode. A third insulating layer is formed on the second insulating layer. The third insulating layer is patterned to form a first contact hole. The second insulating layer corresponding to the first and second signal electrodes is exposed through the first contact hole. The first and second insulating layers are patterned to form a second contact hole. The first and second signal lines are exposed through the second contact hole. The second contact hole is smaller than the first contact hole. A conductive layer electrically connecting the first signal electrode to the second signal electrode is formed.

Therefore, the insulating layers include the opening, through which the first and second signal electrodes are exposed, and the first signal electrode is electrically connected to the second signal electrode through the conductive layer, thereby preventing an open circuit of the conductive layer corresponding to a region adjacent to the contact hole.

BRIEF DESCRIPTION OF THE DRAWINGS

The above and other advantages of the present invention will become more apparent by describing in detail exemplary embodiments thereof with reference to the accompanying drawings, in which:

FIGS. 5A to 5G are cross-sectional views illustrating a method of manufacturing a lower substrate according to an exemplary embodiment of the present invention;

DESCRIPTION OF THE PREFERRED EMBODIMENTS

Hereinafter, the present invention will be described in detail with reference to the accompanying drawings.

Figure 1:
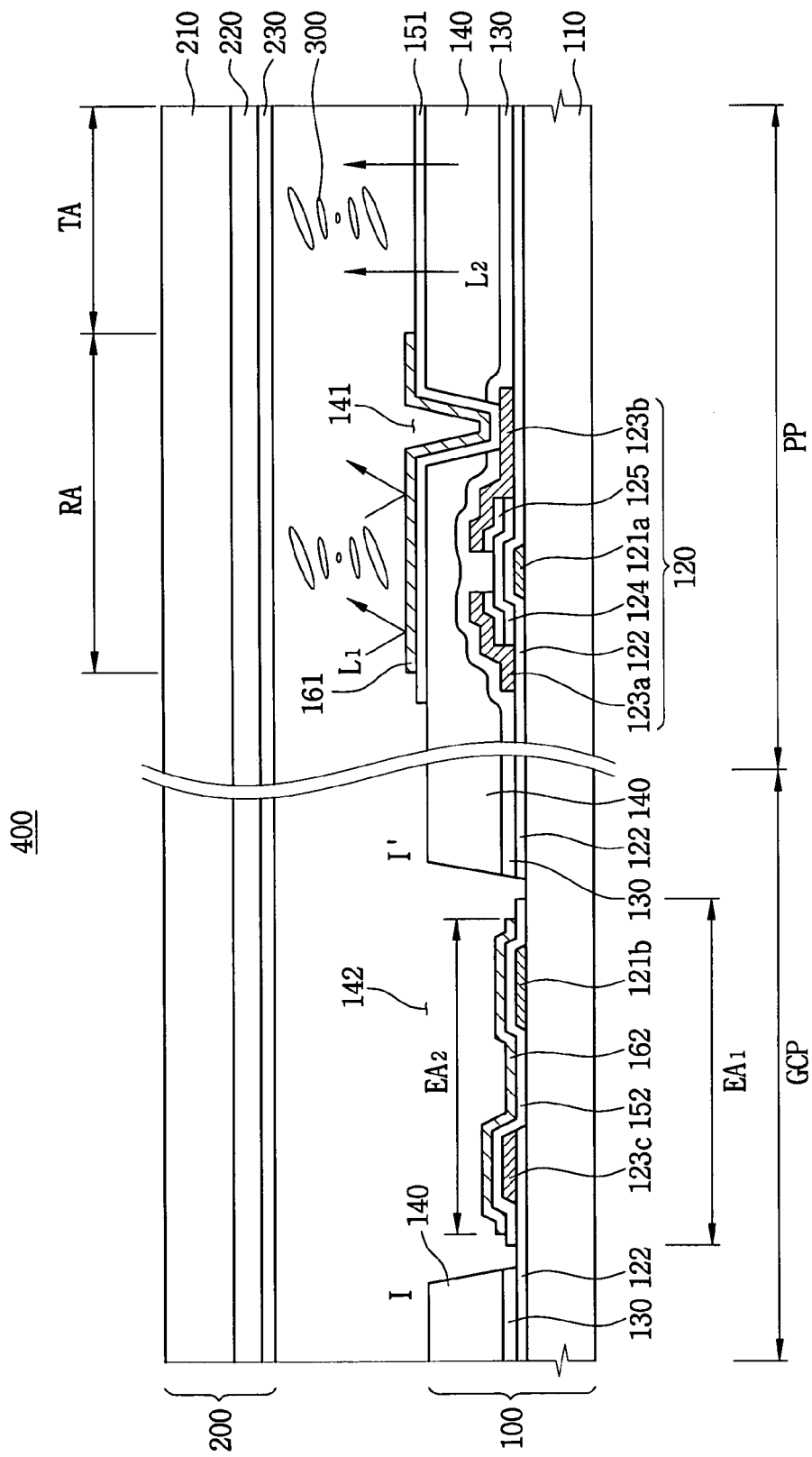
FIG. 1 is a cross-sectional view illustrating a reflective-transmissive LCD apparatus according to an exemplary embodiment of the present invention.
Figure 2:
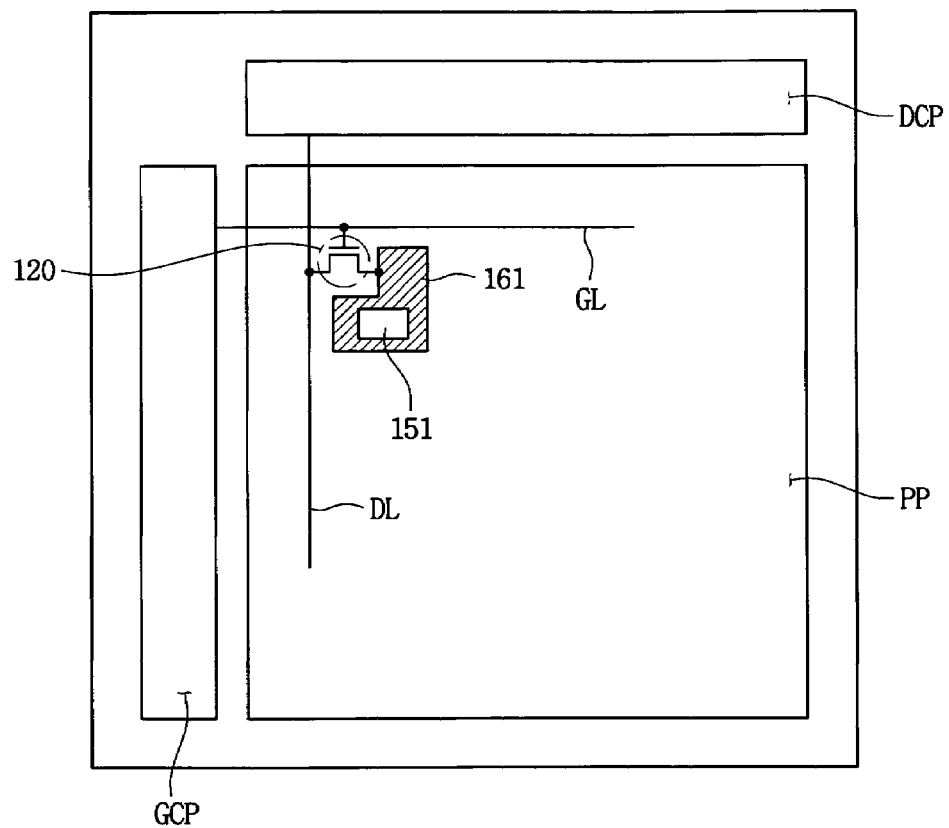
FIG. 2 is a plan view illustrating a reflective-transmissive LCD apparatus according to an exemplary embodiment of the present invention.

FIG. 1 is a cross-sectional view illustrating a reflective-transmissive LCD apparatus according to an exemplary embodiment of the present invention. FIG. 2 is a plan view illustrating a reflective-transmissive LCD apparatus according to an exemplary embodiment of the present invention.

Referring to FIG. 1, the reflective-transmissive LCD apparatus 400 includes a lower substrate 100, an upper substrate 200 corresponding to the lower substrate 100 and a liquid crystal layer 300 interposed between the lower and upper substrates 100 and 200.

Referring to FIG. 2, the lower substrate 100 includes a pixel area PP having a plurality of pixels, a gate circuit area GCP disposed adjacent to the pixel area PP so as to drive the pixel area PP and a data circuit area DCP.

The pixel area PP includes a plurality of pixel portions defined by a plurality of gate and data lines GL and DL adjacent to each other. The gate lines GL are substantially perpendicular to the data lines DL. A pixel having a TFT 120, a first transmission electrode 151 electrically connected to the TFT 120 and a first reflection electrode 161 is disposed in each of the pixel portions.

The gate circuit area GCP is electrically connected to the gate lines GL to apply gate signals to the gate lines GL, in sequence. The data IC unit DCP is electrically connected to the data lines DL to output data signals to the data lines DL.

The gate circuit area GCP is formed on a same layer as the pixels in the pixel area PP. The gate circuit area GCP and the pixels are formed on the lower substrate 100 through a thin film deposition process.

Referring again to FIG. 1, the lower substrate 100 includes a first gate electrode 121a and a second gate electrode 121b. The first gate electrode 121a is formed in the pixel area PP of a first plate 110, and the second gate electrode 121b is formed in the gate circuit area GCP of the first plate 110.

A gate insulating layer 122 is formed on the first plate 110 having the first and second gate electrodes 121a and 121b. The gate insulating layer 122 includes an opening corresponding to the gate circuit area GCP and exposing the second gate electrode 121b. Alternatively, the second gate electrode 121b may be partially exposed through the opening of the gate insulating layer 122.

An active layer 124 is formed on the gate insulating layer 122 so as to cover the first gate electrode 121a. An ohmic contact layer 125 is formed on the active layer 124.

A first data electrode 123a and a second data electrode 123b spaced apart from the first data electrode 123a are formed on the ohmic contact layer 125 and the gate insulating layer 122. Therefore, the TFT 120 is formed on the pixel area PP. In addition, a third data electrode 123c is formed on the gate insulating layer 122 corresponding to the gate circuit area GCP. The third data electrode 123c is spaced apart from the second gate electrode 121b.

An inorganic insulating layer 130 is formed in the pixel area PP and the gate circuit area GCP, and an organic insulating layer 140 is formed on the inorganic insulating layer 130. The inorganic and organic insulating layers 130 and 140 include a first contact hole 141 and a second contact hole 142. The second data electrode 123b is exposed through the first contact hole 141. Alternatively, the second data electrode 123b may be partially exposed through the first contact hole 141. The third data electrode 123c and the second gate electrode 121b are exposed through the second contact hole 142. Alternatively, the third data electrode 123c and the second gate electrode 121b may be partially exposed through the second contact hole 142.

The first transmission electrode 151 is electrically connected to the second data electrode 123b through the first contact hole 141. The second transmission electrode 152 is electrically connected to the exposed portion of the third data electrode 123c and the second gate electrode 121b through the second contact hole 142.

The first reflection electrode 161 is disposed on the first transmission electrode 151, and electrically connected to the second data electrode 123b. The second reflection electrode 162 is disposed on the second transmission electrode 152, and electrically connected to the third data electrode 123c and the second gate electrode 121b.

The first reflection electrode 161 partially covers the first transmission electrode 151. Therefore, the pixel area PP includes a reflection region RA and a transmission region TA. The first reflection electrode 161 is formed in the reflection region RA. The first transmission electrode 151 is exposed through the first reflection electrode 161 in the transmission region TA. Alternatively, the first transmission electrode 151 may be partially exposed through the first reflection electrode 161 in the transmission region TA. A first light $L_1$ that is provided from an exterior to the LCD apparatus is reflected from the first reflection electrode 161 in the reflection region RA. A second light $L_2$ that is generated from a backlight assembly (not shown) passes through the first transmission electrode 151 in the transmission region TA.

Figure 3:
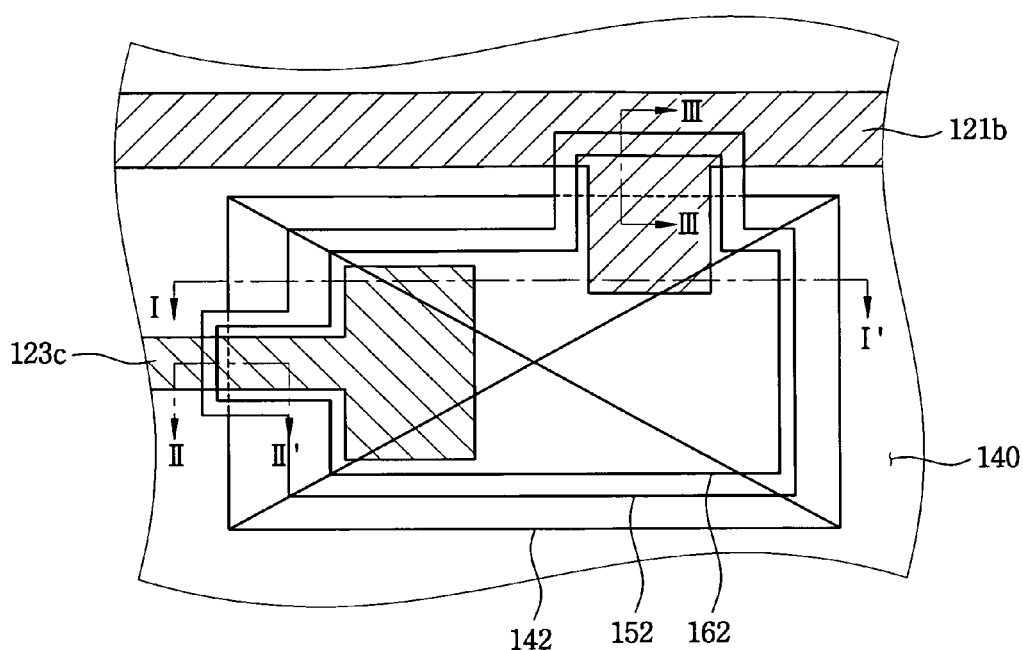
FIG. 3 is a plan view illustrating a gate circuit area according to an exemplary embodiment of the present invention.
Figure 4A:
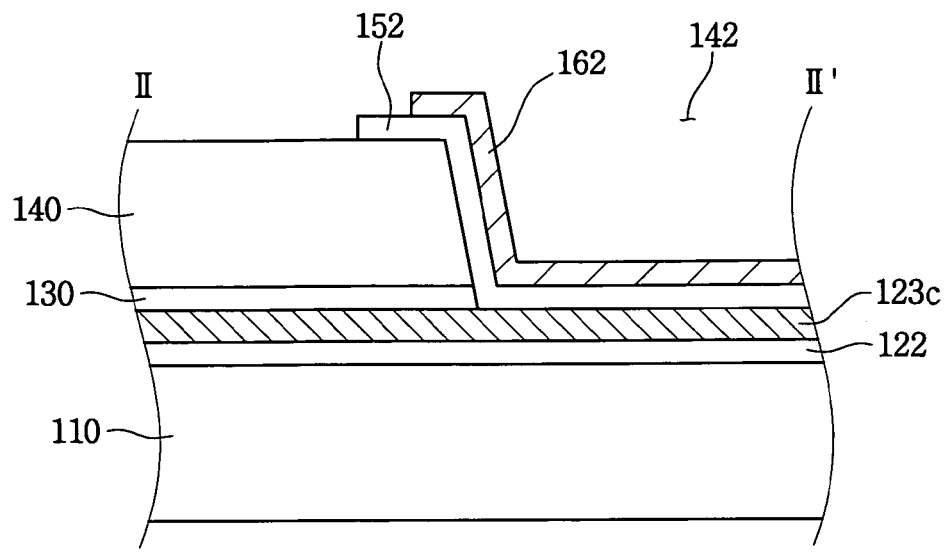
FIG. 4A is a cross-sectional view taken along the line II-II' of FIG. 3.
Figure 4B:
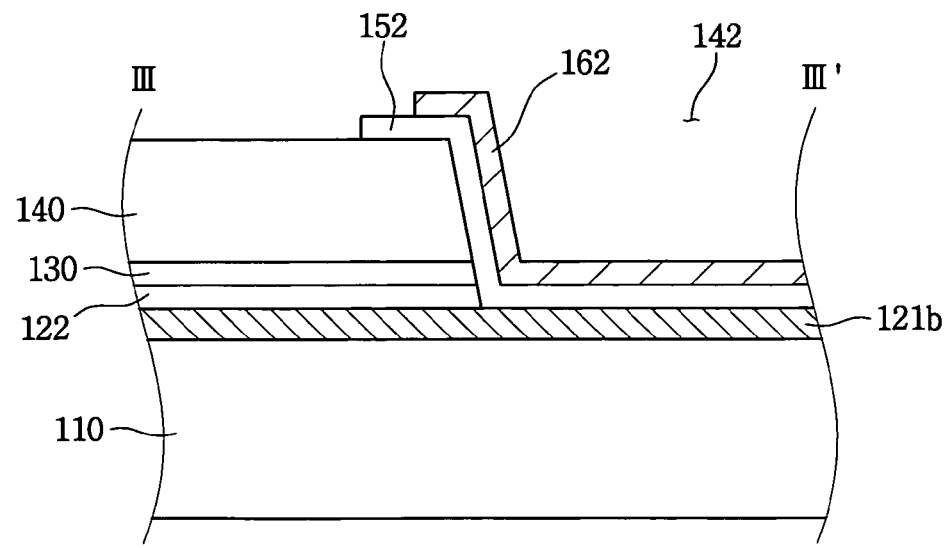
FIG. 4B is a cross-sectional view taken along the line III-III' of FIG. 3.

FIG. 3 is a plan view illustrating a gate circuit area according to an exemplary embodiment of the present invention. FIG. 4A is a cross-sectional view taken along the line II-II' of FIG. 3. FIG. 4B is a cross-sectional view taken along the line III-III' of FIG. 3.

Referring to FIGS. 1 and 3, the third data electrode 123c and the second gate electrode 121b are exposed through the second contact hole 142 in the gate circuit area GCP. Alternatively, the third data electrode 123c and the second gate electrode 121b may be partially exposed through the second contact hole 142. The second transmission electrode 152 is disposed in the second contact hole 142 so that the second transmission electrode 152 is independent from a stepped portion formed between the organic insulating layer 140 and the first plate 110, thereby preventing an open circuit of the second transmission electrode 152.

A second electrode region $EA_2$ including a second reflection electrode 162 is disposed in a first electrode region $EA_1$ including the second transmission electrode 152.

Referring to FIGS. 3 and 4A, an end portion of the second transmission electrode 152 and an end portion of the second reflection electrode 162 are disposed on the organic insulating layer 140 corresponding to a region adjacent to an interface between the third data electrode 123c and the organic insulating layer 140. Therefore, the second transmission electrode 152 and the second reflection electrode 162 cover the exposed portion of the third data electrode 123c that is exposed through the second contact hole 142. Alternatively, the third data electrode 123c may be partially exposed through the second contact hole 142.

Referring to FIGS. 3 and 4B, an end portion of the second transmission electrode 152 and an end portion of the second reflection electrode 162 are disposed on the organic insulating layer 140 corresponding to a region adjacent to an interface between the second gate electrode 121b and the organic insulating layer 140. Therefore, the second transmission electrode 152 and the second reflection electrode 162 cover the exposed portion of the second data electrode 121b that is exposed through the second contact hole 142. Alternatively, the second data electrode 121b may be partially exposed through the second contact hole 142.

Referring again to FIG. 1, the upper substrate 200 includes a second plate 210, a color filter 220 and a common electrode 230. The color filter 220 is disposed on the second plate 210, and includes a red (R) color filter, a green (G) color filter and a blue (B) color filter. The common electrode 230 comprises a transparent conductive material.

The second transmission electrode 152 and the second reflection electrode 162 in the gate circuit area GCP of the lower substrate 100 are disposed in the second contact hole 142. Therefore, a distance between the gate circuit area GCP and the common electrode 230 is longer than in case that the second transmission electrode 152 and the second reflection electrode 162 are disposed on the organic insulating layer 140. When a distance between the gate circuit area GCP and the common electrode 230 increases, parasitic capacitance between the gate circuit area GCP and the common electrode 230 decreases. Therefore, when the second transmission electrode 152 and the second reflection electrode 162 are disposed in the second contact hole, the distance between the gate circuit area GCP and the common electrode 230 is increased so that the parasitic capacitance between the gate circuit area GCP and the common electrode 230 is decreased.

FIGS. 5A to 5G are cross-sectional views illustrating a method of manufacturing a lower substrate according to an exemplary embodiment of the present invention.

Figure 5A:
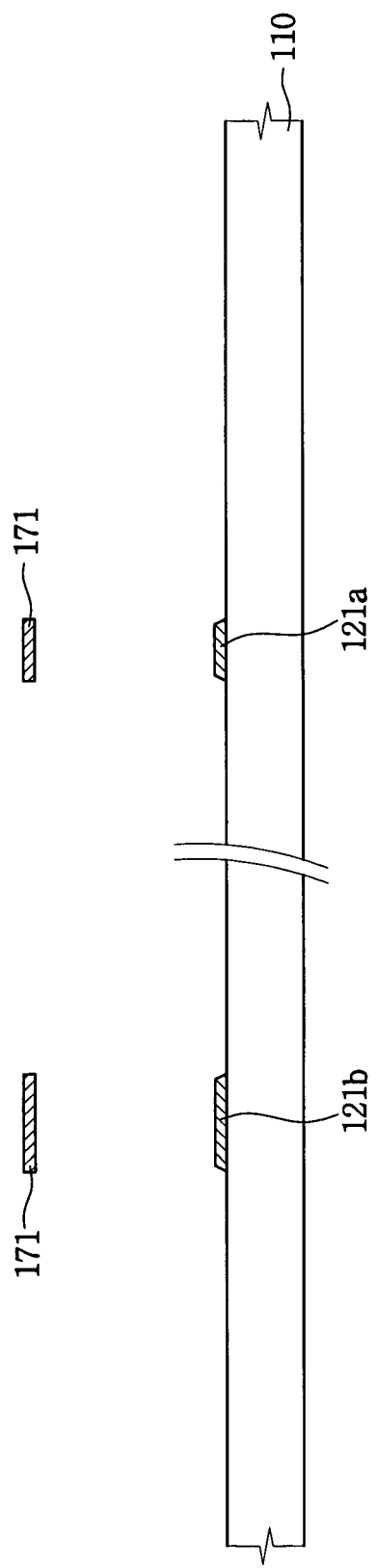

Referring to FIG. 5A, a first metal layer (not shown) including aluminum (Al), chrome (Cr) or molybdenum-tungsten (Mo—W) alloy is deposited on the first plate 110 having an insulating material, for example, such as a glass, a ceramic, etc. through a sputtering process. The first metal layer (not shown) is then patterned through a photolithography process using a first mask 171. Therefore, the first and second gate electrodes 121a and 121b are formed on the pixel area PP and the gate circuit area GCP, respectively. The first gate electrode 121a is formed from a same layer as the second gate electrode 121b.

Figure 5B:
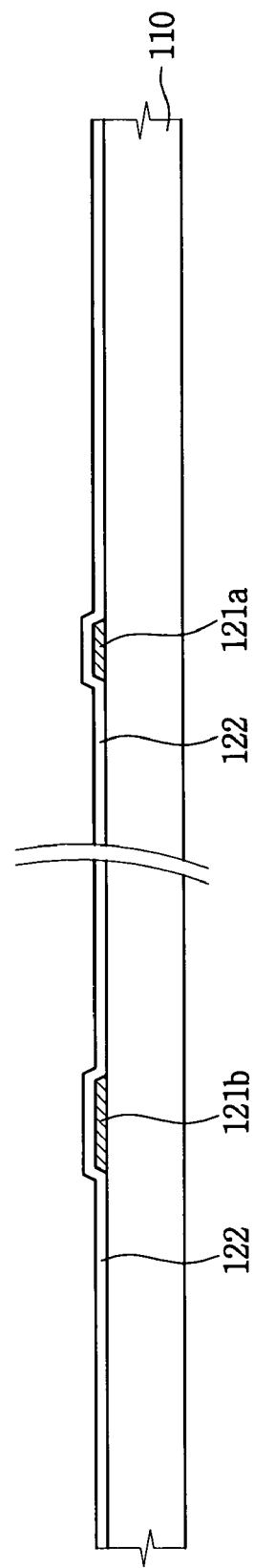

Referring to FIG. 5B, silicon nitride is deposited on the first plate 110 including the first and second gate electrodes 121a and 121b to form the gate insulating layer 122. The silicon nitride may be deposited through a plasma-enhanced chemical vapor deposition (PECVD).

Figure 5C:
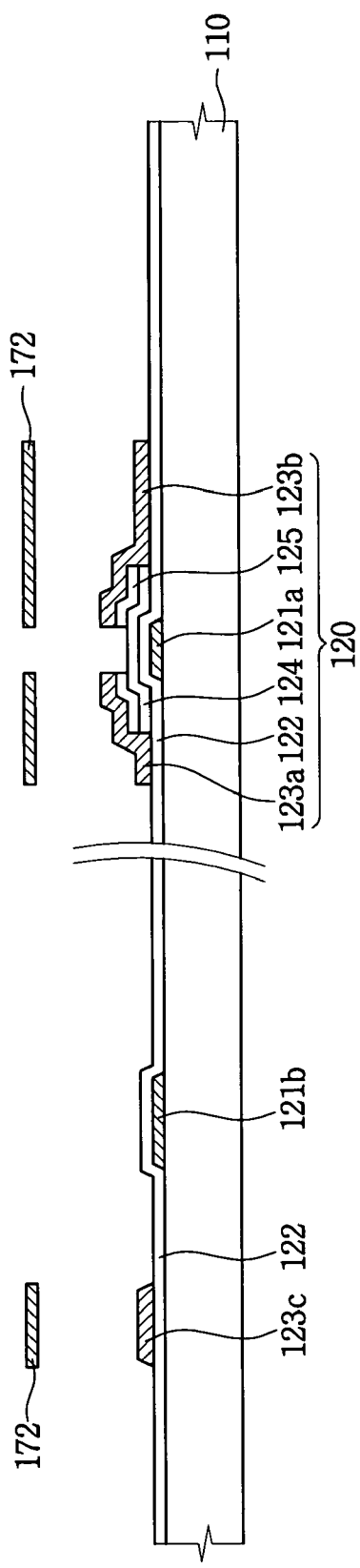

Referring to FIG. 5C, an amorphous silicon layer (not shown) and an N+ doped amorphous silicon layer (not shown) are formed on the gate insulating layer 122. The amorphous silicon layer (not shown) and the N+ doped amorphous silicon layer (not shown) may be deposited through an in-situ PECVD process in a chamber.

The amorphous silicon layer (not shown) and the N+ doped amorphous silicon layer (not shown) are patterned to form the active layer 124 and the ohmic contact layer 125 in the region corresponding to the first gate electrode 121a.

A second metal layer (not shown) is formed on the first plate 110 having the ohmic contact layer 125. The second metal layer (not shown) may comprise chrome (Cr). The second metal layer (not shown) may be formed through a sputtering process. The second metal layer (not shown) is patterned through a photolithography process using a second mask 172 so as to form the first and second data electrodes 123a and 123b in the pixel area PP and the third data electrode 123c in the gate circuit area GCP.

The first and second data electrodes 123a and 123b are formed from a same layer as the third data electrode 123c. The third data electrode 123c is electrically connected to the exposed portion of the second gate electrode 121b corresponding to the second contact hole 142.

An exposed portion of the ohmic contact layer 125 disposed between the first and second data electrodes 123a and 123b is removed so that a portion of the active layer 124 disposed between the first and second data electrodes 123a and 123b is exposed. The exposed ohmic contact layer 125 may be removed through a reactive ion etching (RIE) process. The exposed active layer 124 functions as a channel layer of the TFT. Therefore, the TFT 120 is formed in the pixel area PP.

Figure 5D:
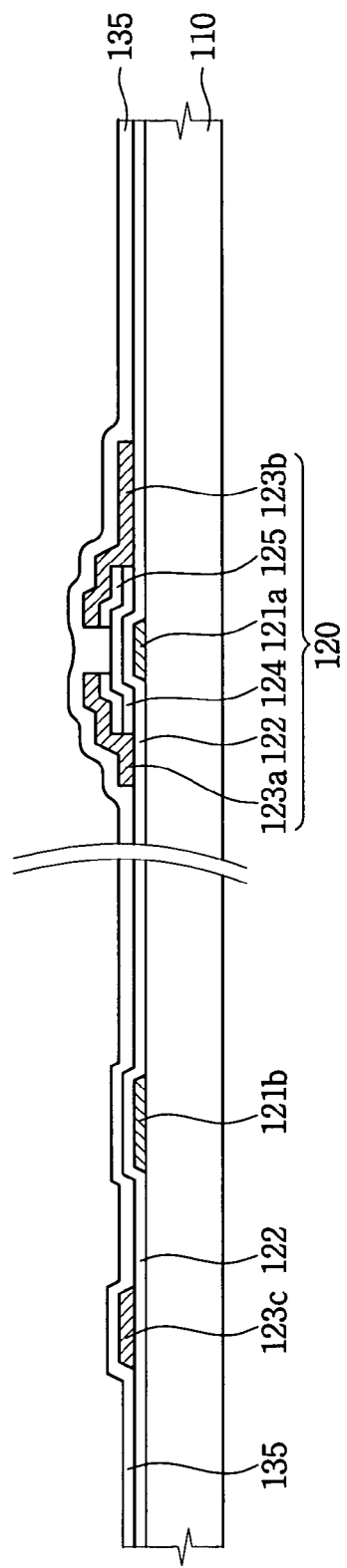

Referring to FIG. 5D, the inorganic insulating layer 130 having silicon nitride (SiNx) or silicon oxide (SiOx) is then formed over the pixel area PP and the gate circuit area GCP.

Figure 5E:
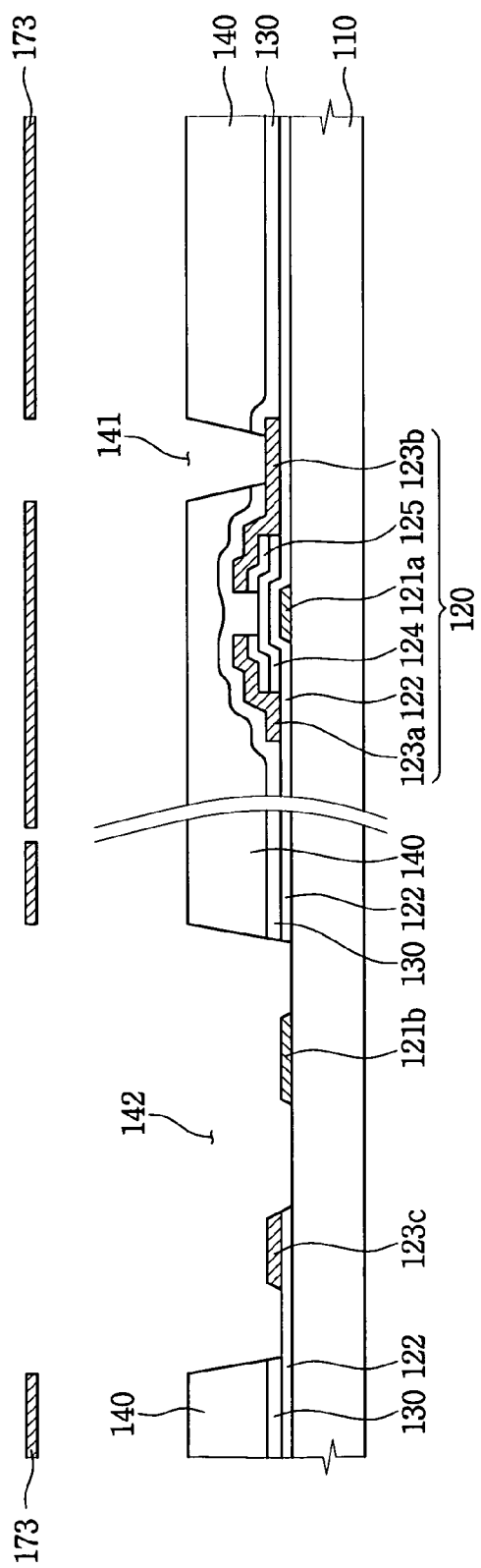

Referring to FIG. 5E, an organic insulating layer 140 including a photosensitive acryl resin is formed on the inorganic insulating layer 130. The inorganic insulating layer 130 and the organic insulating layer 140 are patterned using a third mask to form the first contact hole 141 and the second contact hole 142. The second data electrode 123b is exposed through the first contact hole 141, and the third data electrode 123c and the second gate electrode 121b are exposed through the second contact hole 142. Alternatively, the second data electrode 123b may be partially exposed through the first contact hole 141, and the third data electrode 123c and the second gate electrode 121b may be partially exposed through the second contact hole 142.

Referring to FIG. 5F, a first conductive layer (not shown) including a transparent conductive material, for example, such as indium tin oxide (ITO), indium zinc oxide (IZO) or zinc oxide (ZO) is then formed over the lower substrate 100. The first conductive layer (not shown) is then patterned using a fourth mask 174 to form the first and second transmission electrodes 151 and 152. The first and second transmission electrodes 151 and 152 are disposed in the pixel area PP and the gate circuit area GCP, respectively.

The first transmission electrode 151 is electrically connected to the exposed portion of the second data electrode 123b that is exposed through the first contact hole 141. Alternatively, the second data electrode 123b may be partially exposed through the first contact hole 141. The second transmission electrode 152 is electrically connected to the exposed portion of the third data electrode 123c and the second gate electrode 121b, the exposed portion of the third data electrode 123c and the second gate electrode 121b being exposed through the second contact hole 142. Alternatively, the third data electrode 123c and the second gate electrode 121b may be partially exposed through the second contact hole 142. Therefore, the third data electrode 123c is electrically connected to the second gate electrode 121b through the second transmission electrode 152.

The first electrode region $EA_1$ is disposed in the second contact hole 142. The second transmission electrode 152 is disposed in the first electrode region $EA_1$ so that electric characteristics of the second transmission electrode 152 are independent from the stepped portion formed between the organic insulating layer 140 and the first plate 110, thereby preventing an open circuit of the second transmission electrode 152.

Figure 5G:
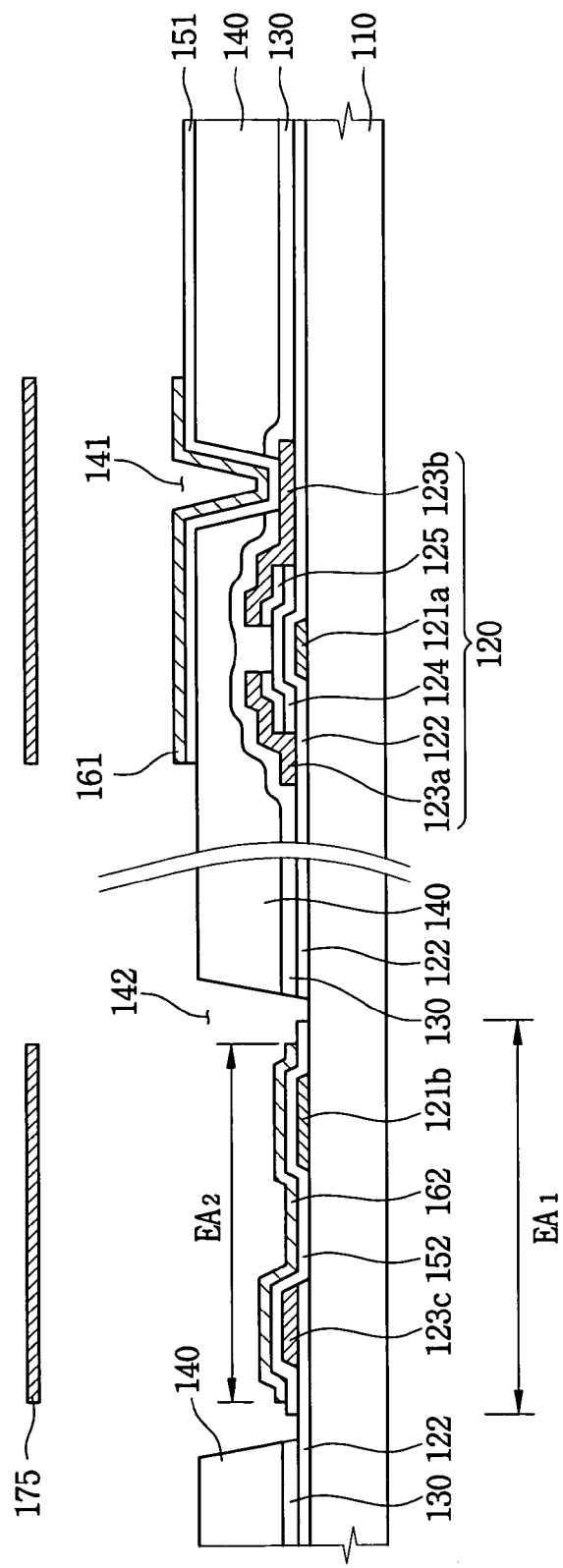

Referring to FIG. 5G, a second conductive layer (not shown) including aluminum-neodymium (Al—Nd) is then formed over the lower substrate 100. The second conductive layer (not shown) is patterned using a fifth mask 175 to form the first and second reflection electrodes 161 and 162. The first reflection electrode 161 is disposed in the pixel area PP, and the second reflection electrode 162 is disposed in the gate circuit area GCP.

The first reflection electrode 161 is electrically connected to the second data electrode 123b through the first transmission electrode 151. The second reflection electrode 162 is electrically connected to the third data electrode 123c and the second gate electrode 121b through the second transmission electrode 152.

The second reflection electrode 162 is a redundancy electrode for the second transmission electrode 152. Therefore, the second reflection electrode 161 maintains electrical connection between the third data electrode 123c and the second gate electrode 121b, although the second transmission electrode 152 is open circuited during the manufacturing process.

A galvanic corrosion may be formed between the aluminum-neodymium (Al—Nd) alloy and the second transparent electrode 152 during the patterning of the second reflection electrode 162. In particular, when the second transparent electrode 152 comprises IZO, the galvanic corrosion is greatly increased due to a difference of ionization tendency between the aluminum-neodymium and the zinc.

Therefore, the second reflection electrode 162 is disposed in the first electrode region $EA_1$ where the second transmission electrode 152 is disposed. Thus, the area where the Al—Nd makes contact with the IZO is decreased so as to prevent the galvanic corrosion.

Figure 6:
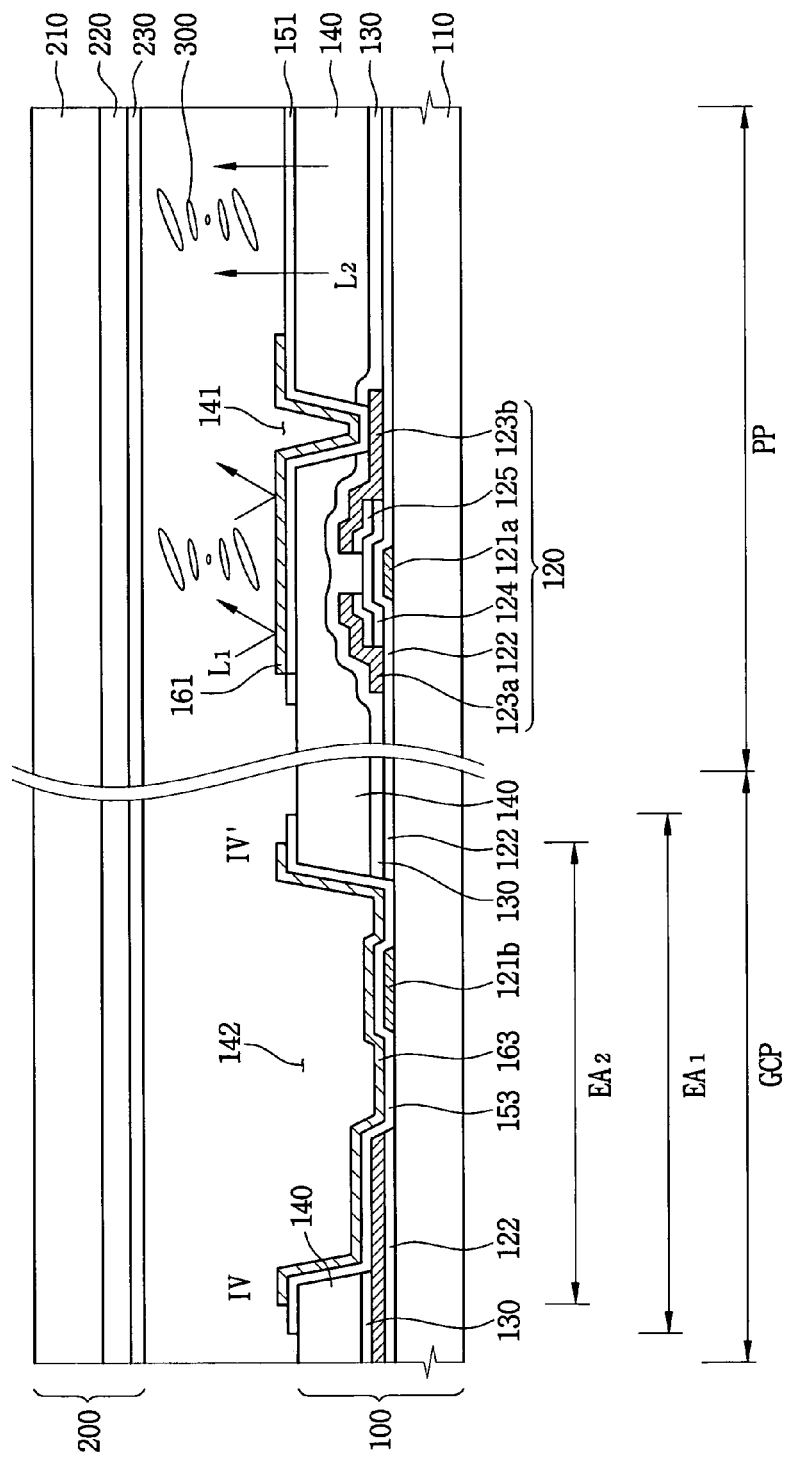
FIG. 6 is a cross-sectional view illustrating a reflective-transmissive LCD apparatus according to another exemplary embodiment of the present invention.
Figure 7:
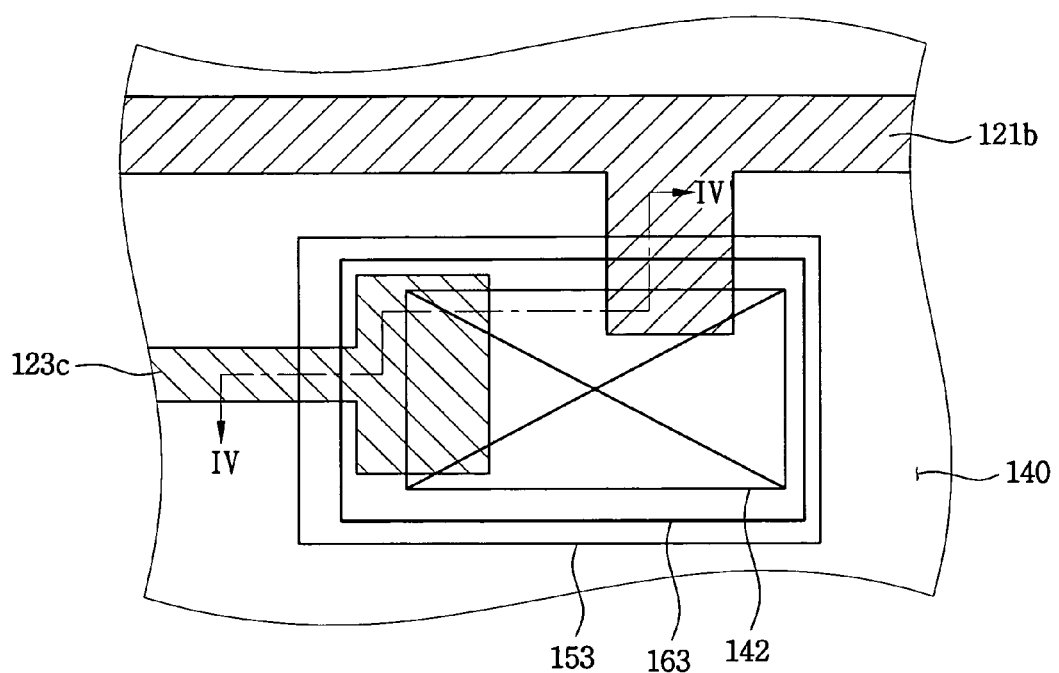
FIG. 7 is a plan view illustrating a gate circuit area according to another exemplary embodiment of the present invention.

FIG. 6 is a cross-sectional view illustrating a reflective-transmissive LCD apparatus according to another exemplary embodiment of the present invention. FIG. 7 is a plan view illustrating a gate circuit area according to another exemplary embodiment of the present invention. The reflective-transmissive LCD apparatus of FIGS. 6 and 7 is same as in FIGS. 1 to 3 except for a lower substrate. Thus, the same reference numerals will be used to refer to the same or like parts as those described in FIGS. 1 to 3 and any further explanation will be omitted.

Referring to FIGS. 6 and 7, the lower substrate 100 includes a second plate 110, an inorganic insulating layer 130 and an organic insulating layer 140. The inorganic insulating layer 130 and the organic insulating layer 140 are consecutively formed on the second plate 110. The inorganic insulating layer 130 and the organic insulating layer 140 includes a second contact hole 142. A third data electrode 123c and a second gate electrode 121b are exposed in a gate circuit area GCP through the second contact hole 142. Alternatively, the third data electrode 123c and the second gate electrode 121b may be partially exposed in the gate circuit area GCP through the second contact hole 142.

A third transmission electrode 153 is electrically connected to the third data electrode 123c and the second gate electrode 121b through the second contact hole 142. The second contact hole 143 is disposed in a first electrode region $EA_1$ where the third transmission electrode 153 is formed. That is, an end portion of the third transmission electrode 153 is disposed on the organic insulating layer 140 corresponding to a region adjacent to the second contact hole 143.

The third reflection electrode 163 is disposed on the third transmission electrode 153 so that the third reflection electrode 163 is electrically connected to the third data electrode 123c and the second gate electrode 121b. A second electrode region $EA_2$ where the third reflection electrode 163 is formed is disposed in the first electrode region $EA_1$, thereby preventing a galvanic corrosion between the third reflection electrode 163 and the third transmission electrode 153.

Figure 8:
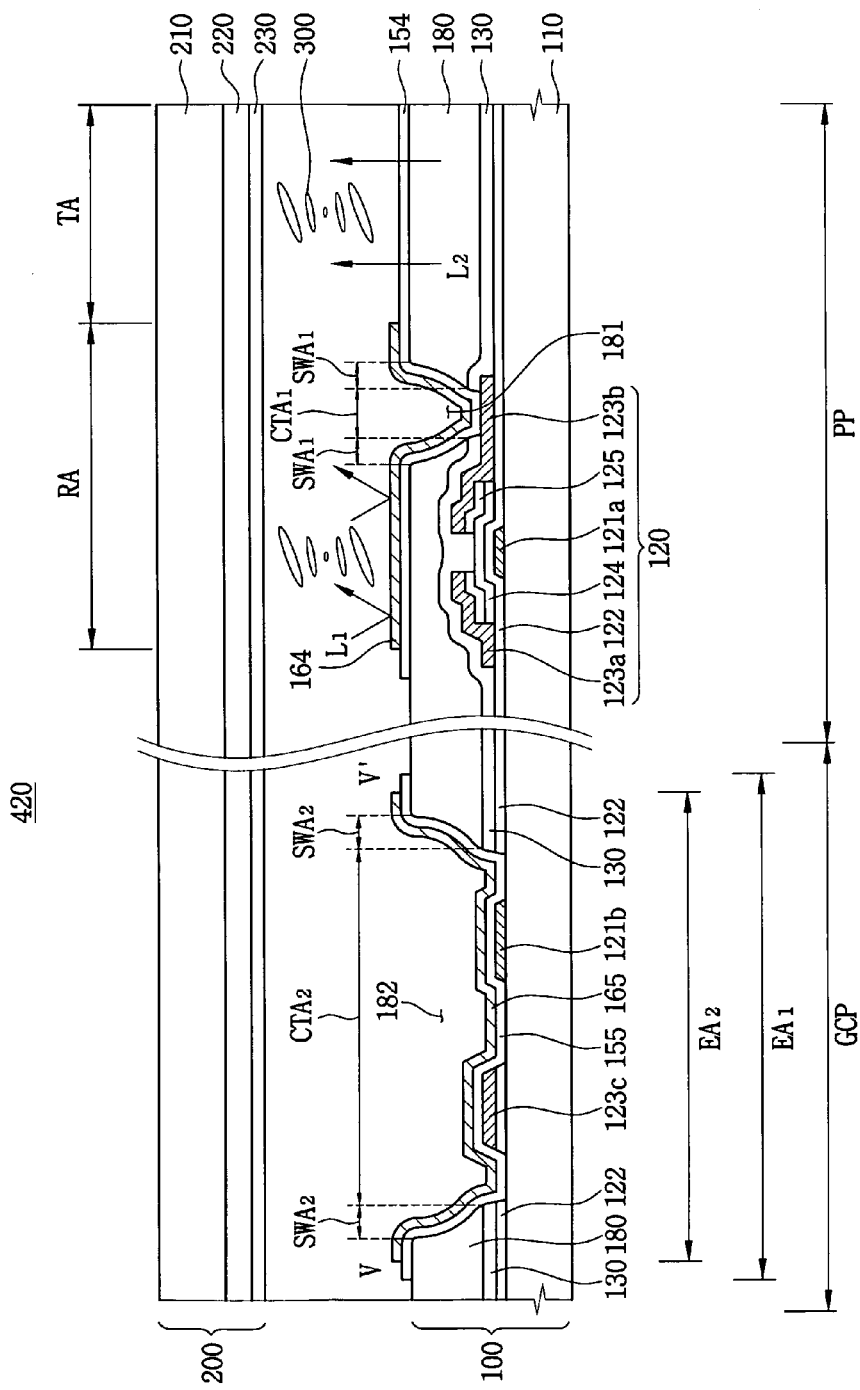
FIG. 8 is a cross-sectional view illustrating a reflective-transmissive LCD apparatus according to another exemplary embodiment of the present invention.
Figure 9:
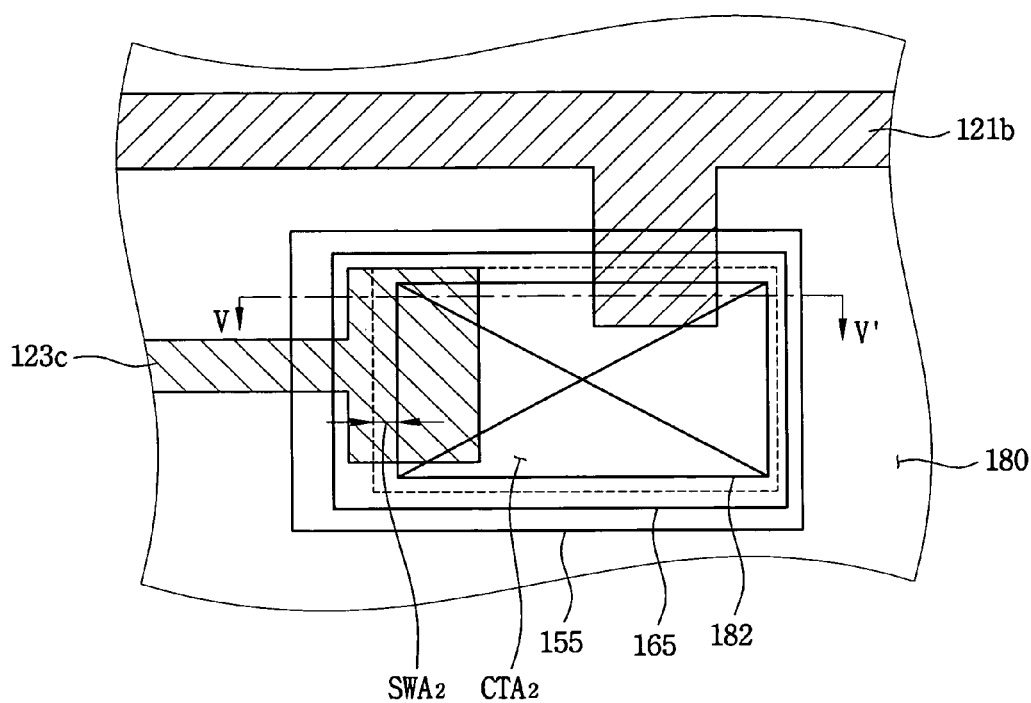
FIG. 9 is a plan view illustrating a gate circuit area according to another exemplary embodiment of the present invention.

FIG. 8 is a cross-sectional view illustrating a reflective-transmissive LCD apparatus according to another exemplary embodiment of the present invention. FIG. 9 is a plan view illustrating a gate circuit area according to another exemplary embodiment of the present invention. The reflection-transmissive LCD apparatus of FIGS. 8 and 9 is same as in FIGS. 1 to 3 except a lower substrate. Thus, the same reference numerals will be used to refer to the same or like parts as those described in FIGS. 1 to 3 and any further explanation will be omitted.

Referring to FIG. 8, an inorganic insulating layer 130 and an organic insulating layer 180 are formed on a pixel area PP and a gate circuit area GCP of a lower substrate 100. The inorganic insulating layer 130 and the organic insulating layer 140 include a third contact hole 181 and a fourth contact hole 182. A second data electrode 123b of a TFT 120 is exposed through the third contact hole 181. Alternatively, the second data electrode 123b of a TFT 120 may be partially exposed through the third contact hole 181. A third data electrode 123c and a second gate electrode 121b are exposed through the fourth contact hole 182. Alternatively, the third data electrode 123c and a second gate electrode 121b may be partially exposed through the fourth contact hole 182.

A first contact region CTA1 is disposed in the third contact hole 181. A second contact region CTA2 is disposed in the fourth contact hole 182. The organic insulating layer 180 includes a first sidewall region SWA1 adjacent to the first contact region CTA1 and a second sidewall region SWA2 adjacent to the second contact region CTA2. The cross-section of the organic insulating layer 180 corresponding to the first and second sidewall regions SWA1 and SWA2 has a curved shape.

Referring to FIGS. 8 and 9, the fourth transmission electrode 154 is disposed on the organic insulating layer 180 corresponding to the pixel area PP and the exposed portion of the second data electrode 123b that is exposed through the third contact hole 181. The fifth transmission electrode 155 is electrically connected to the third data electrode 123c and the second gate electrode 121b through the fourth contact hole 182 in the gate circuit area GCP.

A portion of the fifth transmission electrode 155 is disposed on the organic insulating layer 180 adjacent to the fourth contact hole 182. Therefore, the second contact region CTA2 corresponding to the fourth contact hole 182 is disposed in a first electrode region $EA_1$. The fifth transmission electrode 155 is formed in the first electrode region $EA_1$.

The cross-section of the organic insulating layer 180 corresponding to the second sidewall region SWA2 has the curved shape so that the cross-section of the organic insulating layer 180 adjacent to an interface between the organic insulating layer 180 and the first plate 110 is gently sloped. Therefore, although the portion of the fifth transmission electrode 155 is disposed on the organic insulating layer 180, an open circuit of the fifth transmission electrode 155 in the second sidewall region SWA2 is prevented.

The fourth reflection electrode 164 is disposed on the fourth transmission electrode 154 in the pixel area PP so that the fourth reflection electrode 164 is electrically connected to the second data electrode 123b. The fifth reflection electrode 165 is disposed on the fifth transmission electrode 155 in the gate circuit area GCP so that the fifth reflection electrode 165 is electrically connected to the third data electrode 123c and the second gate electrode 121b. A second electrode region $EA_2$ corresponding to the fifth reflection electrode 165 is disposed in the first electrode region $EA_1$ corresponding to the fifth transmission electrode 155.

FIGS. 10A to 10D are cross-sectional views illustrating a method of manufacturing a lower substrate according to another exemplary embodiment of the present invention.

Figure 10A:
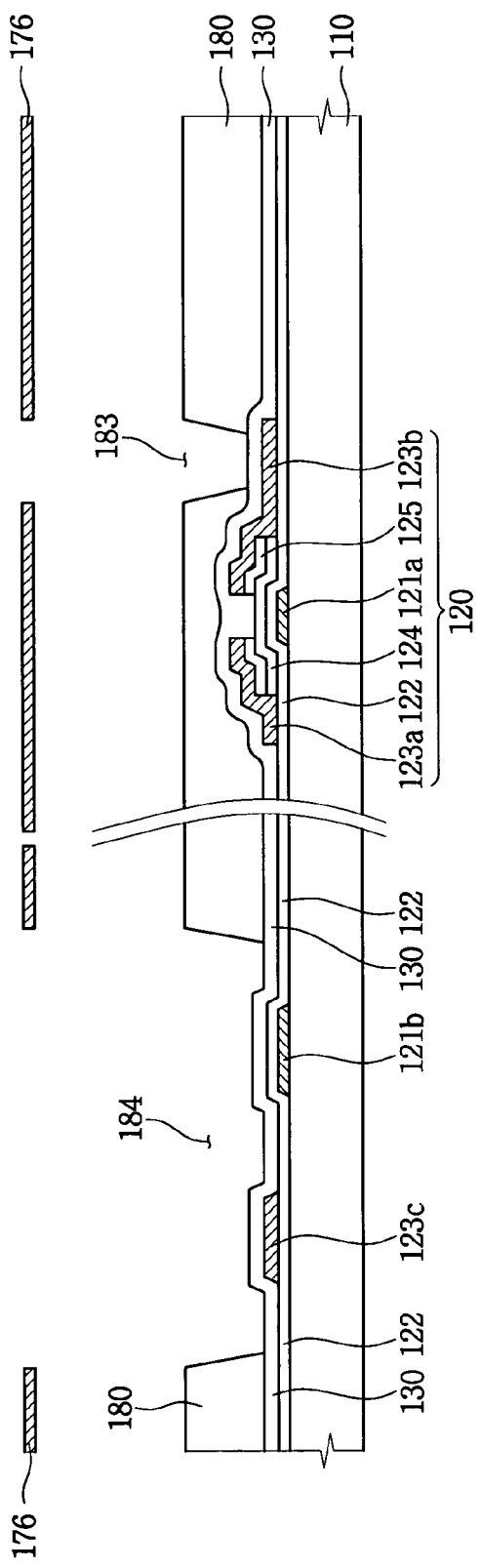
FIGS. 10A to 10D are cross-sectional views illustrating a method of manufacturing a lower substrate according to another exemplary embodiment of the present invention.

Referring to FIG. 10A, an organic insulating layer 180 including a photosensitive acryl resin is formed on the inorganic insulating layer 130. The organic insulating layer 180 is patterned using a sixth mask 176 disposed on the organic insulating layer 180 to form the fifth contact hole 183 and the sixth contact hole 184. The inorganic insulating layer 130 corresponding to the second data electrode 123b is partially exposed through the fifth contact hole 183. Alternatively, the inorganic insulating layer 130 corresponding to the second data electrode 123b may be partially exposed through the fifth contact hole 183. The inorganic insulating layer 130 corresponding to the third data electrode 123c and the second gate electrode 121b is exposed through the sixth contact hole 184. Alternatively, the inorganic insulating layer 130 corresponding to the third data electrode 123c and the second gate electrode 121b may be partially exposed through the sixth contact hole 184.

Figure 10B:
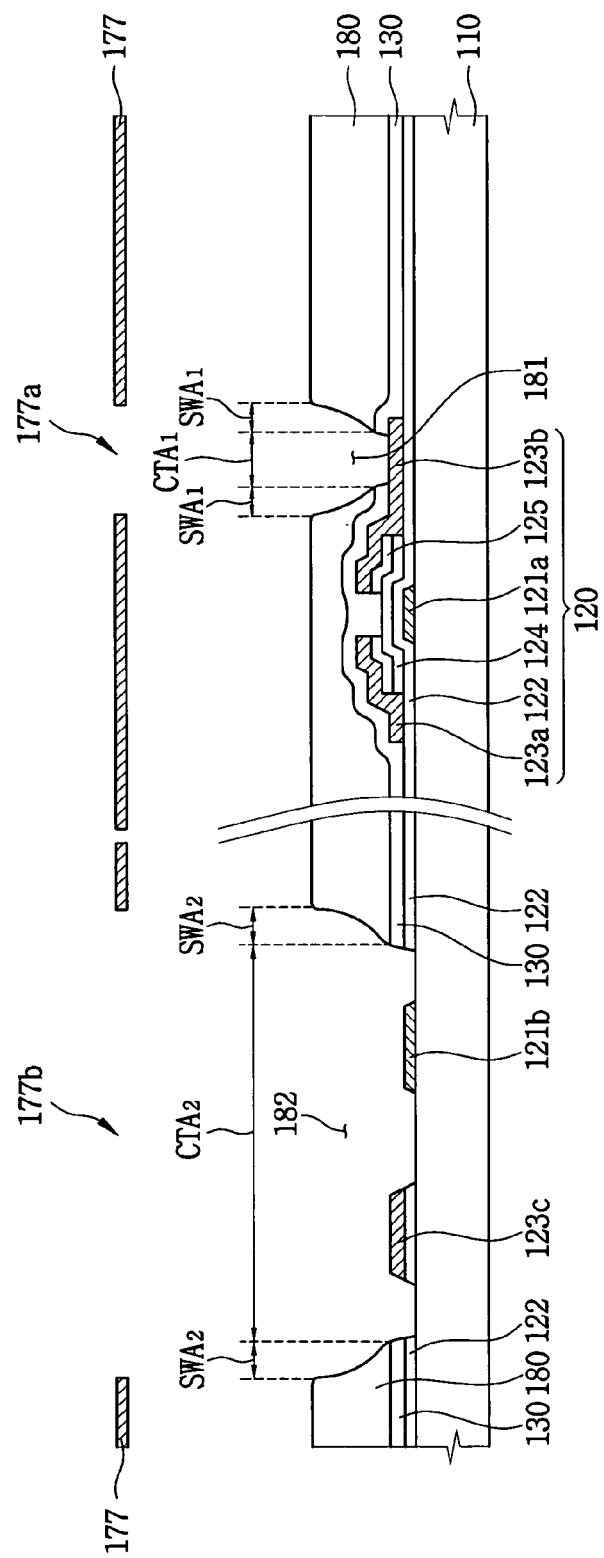

Referring to FIG. 10B, a seventh mask 177 having a first transparent portion 177a and a second transparent portion 177b is disposed over the organic insulating layer 180 so that the organic insulating layer 180 adjacent to the fifth contact hole 183 and the organic insulating layer 180 adjacent to the sixth contact hole 184 are exposed through the first and second transparent portions 177a and 177b, respectively. Alternatively, the organic insulating layer 180 adjacent to the fifth contact hole 183 and the organic insulating layer 180 adjacent to the sixth contact hole 184 may be partially exposed through the first and second transparent portions 177a and 177b, respectively. The first and second transparent portions 177a and 177b are larger than the fifth and sixth contact holes 183 and 184, respectively.

The organic insulating layer 180 is patterned using the seventh mask 177. Thus, the organic insulating layer 180 adjacent to the fifth contact hole 183, the organic insulating layer 180 adjacent to the sixth contact hole 184, the inorganic insulating layer 130 corresponding to the fifth contact hole 183 and the inorganic insulating layer 130 corresponding to the sixth contact hole 184 are removed.

Therefore, the third contact hole 181 corresponding to the fifth contact hole 183 and the fourth contact hole 182 corresponding to the sixth contact hole 184 are formed in the organic insulating layer 180 and the inorganic insulating layer 130. The cross-section of the organic insulating layer 180 corresponding to the first and second sidewall regions SWA1 and SWA2 has the curved shape so that the cross-section of the organic insulating layer 180 adjacent to an interface between the organic insulating layer 180 and the first plate 110 is gently sloped. The first and second sidewall regions SWA1 and SWA2 are adjacent to the first and second contact regions CTA1 and CTA2, respectively.

Figure 10C:
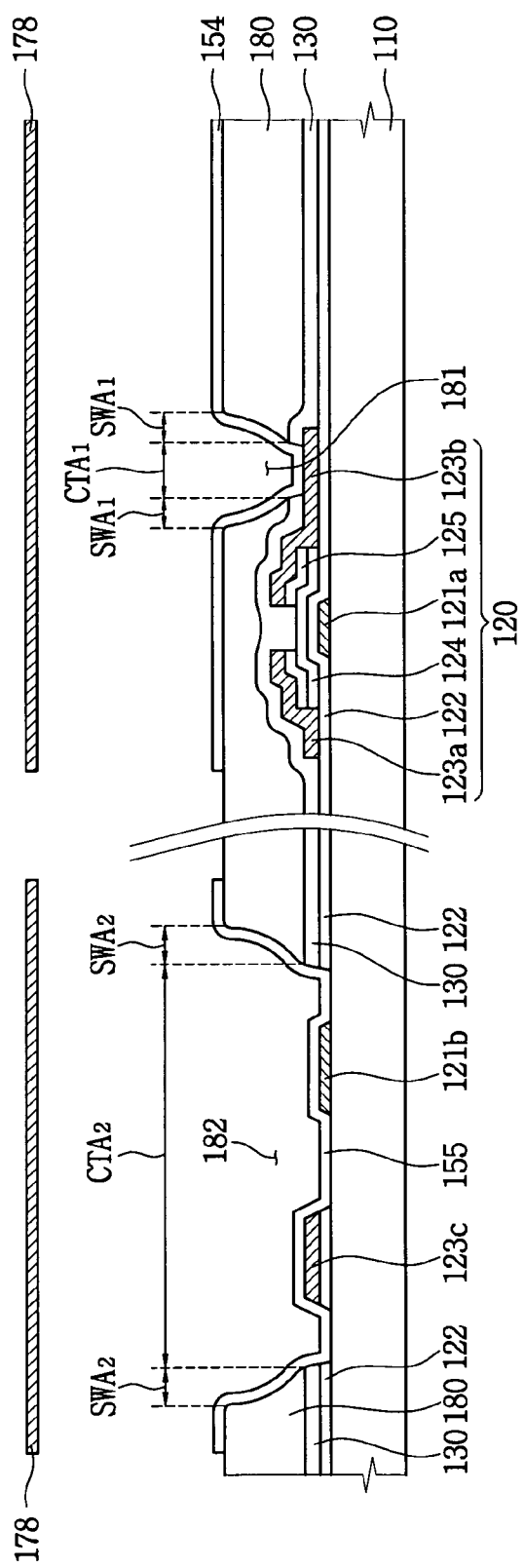

Referring to FIG. 10C, a first conductive layer (not shown) including ITO, IZO or ZO is formed over the lower substrate 100. The first conductive layer (not shown) is patterned using an eighth mask 178 to form the fourth and fifth transmission electrodes 154 and 155. The fourth and fifth transmission electrodes 154 and 155 are disposed in the pixel area PP and the gate circuit area GCP, respectively.

An end portion of the fifth transmission electrode 155 is disposed on the organic insulating layer 180 adjacent to the second contact hole 182. The fourth contact hole 182 is disposed in the first electrode region $EA_1$ corresponding to the fifth transmission electrode 155.

The cross-section of the organic insulating layer 180 corresponding to the first and second sidewall regions SWA1 and SWA2 has the curved shape so that the cross-section of the organic insulating layer 180 adjacent to an interface between the organic insulating layer 180 and the first plate 110 is gently sloped, thereby preventing an open circuit of the second transmission electrode 152.

Figure 10D:
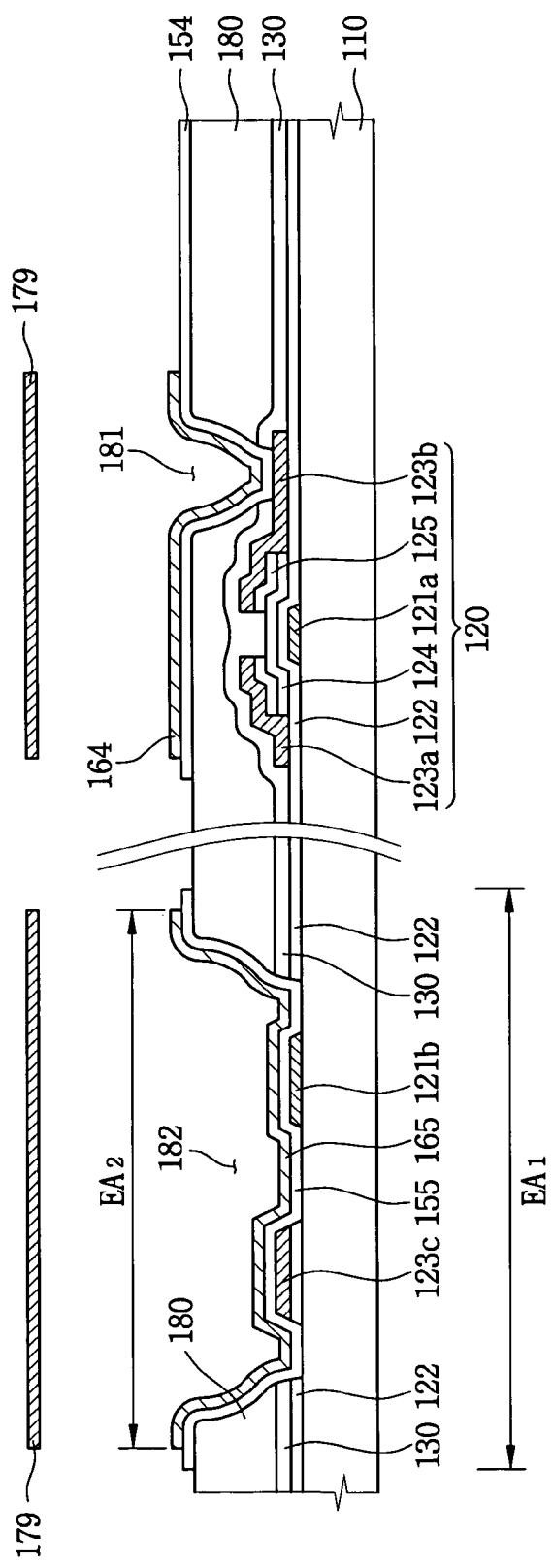

Referring to FIG. 10D, a second conducting layer (not shown) including Al—Nd alloy is formed over the lower substrate 100. The second conducting layer (not shown) is patterned using a ninth mask 179 to form the fourth and fifth reflection electrodes 164 and 165. The fourth reflection electrode 164 is disposed in the pixel area PP. The fifth reflection electrode 165 is disposed in the gate circuit area GCP.

The fifth reflection electrode 165 is electrically connected to the third data electrode 123c and the second gate electrode 121b through the fifth transmission electrode 155. The second electrode region $EA_2$ corresponding to the fifth reflection electrode 165 is disposed in the first electrode region $EA_1$ corresponding to the fifth transmission electrode 155. Therefore, the area where the fifth reflection electrode 165 makes contact with the fifth transmission electrode 155 is decreased so as to prevent the galvanic corrosion.

Figure 11:
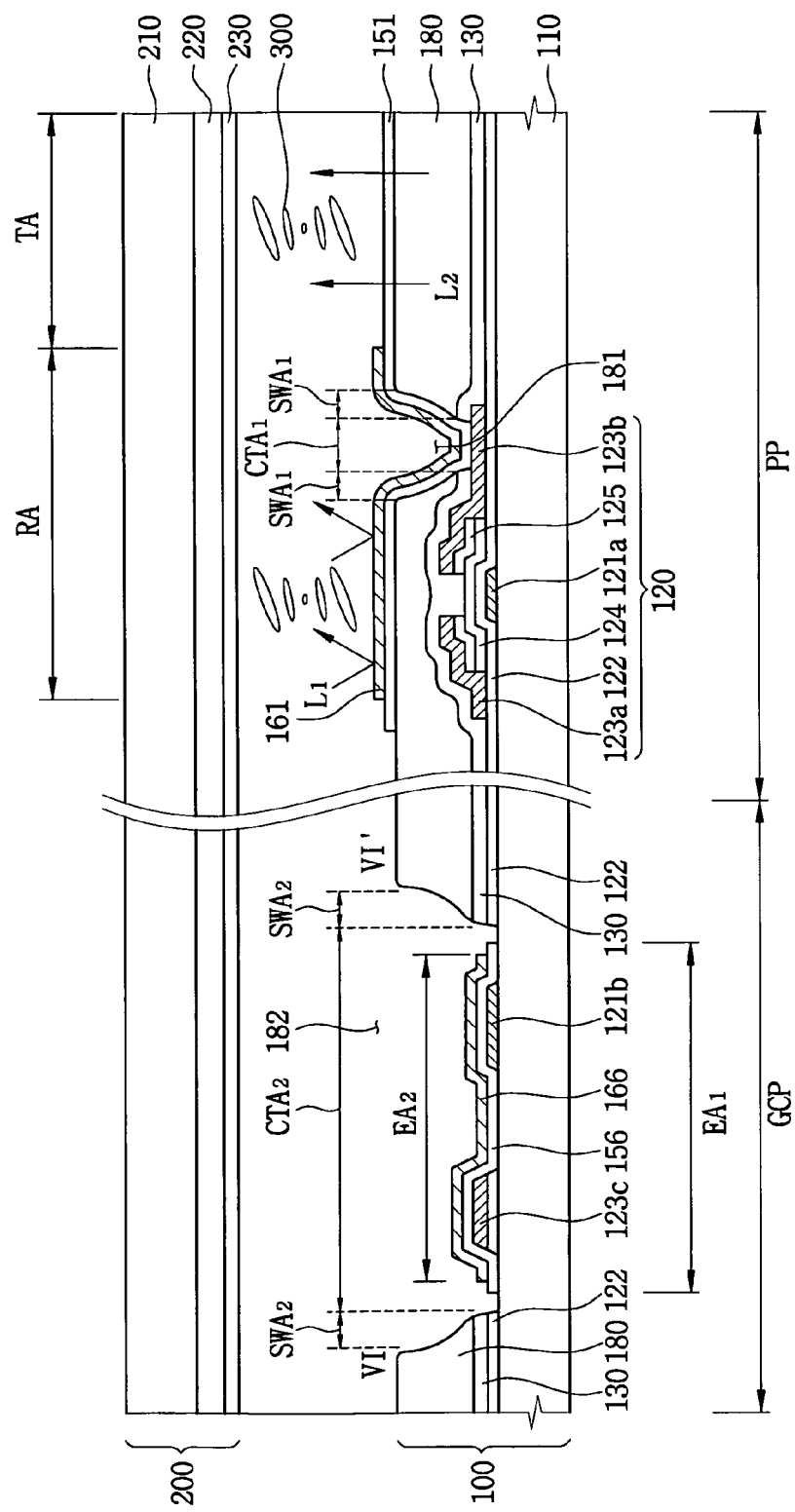
FIG. 11 is a cross-sectional view illustrating a reflective-transmissive LCD apparatus according to another exemplary embodiment of the present invention.
Figure 12:
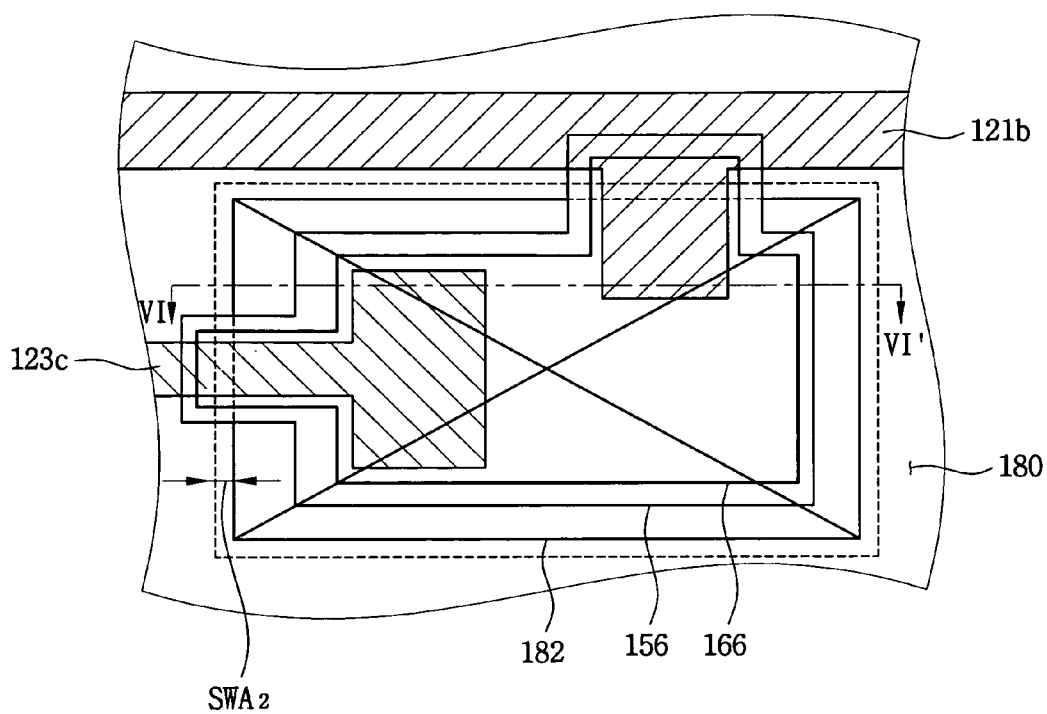
FIG. 12 is a plan view illustrating a gate circuit area according to another exemplary embodiment of the present invention.

FIG. 11 is a cross-sectional view illustrating a reflective-transmissive LCD apparatus according to another exemplary embodiment of the present invention. FIG. 12 is a plan view illustrating a gate circuit area according to another exemplary embodiment of the present invention. The reflective-transmissive LCD apparatus of FIGS. 11 and 12 is same as in FIGS. 1 to 3 except for a lower substrate 100. Thus, the same reference numerals will be used to refer to the same or like parts as those described in FIGS. 1 to 3 and any further explanation will be omitted.

Referring to FIGS. 11 and 12, a sixth transmission electrode 156 is disposed in a second contact region CTA2 of a gate circuit area GCP. The fourth contact hole 182 is formed in the second contact region CTA2. A sixth reflection electrode 166 corresponding to a second electrode region $EA_2$ is disposed in the first electrode region $EA_1$ corresponding to the sixth transmission electrode 156.

A portion of the sixth transmission electrode 156 and a portion of the sixth reflection electrode 166 are disposed on an organic insulating layer 180 adjacent to a third data electrode 123c and a second gate electrode 121b. Thus, the sixth transmission electrode 156 and the sixth reflection electrode 166 cover the third data electrode 123c corresponding to the fourth contact hole 182 and the second gate electrode 121b corresponding to the fourth contact hole 182.

The cross-section of the organic insulating layer 180 in a second sidewall region SWA2 that is adjacent to the second contact region CTA2 has a curved shape, thereby preventing an open circuit of the sixth transmission electrode 156 and the sixth reflection electrode 166 in the second sidewall region SWA2.

Figure 13:
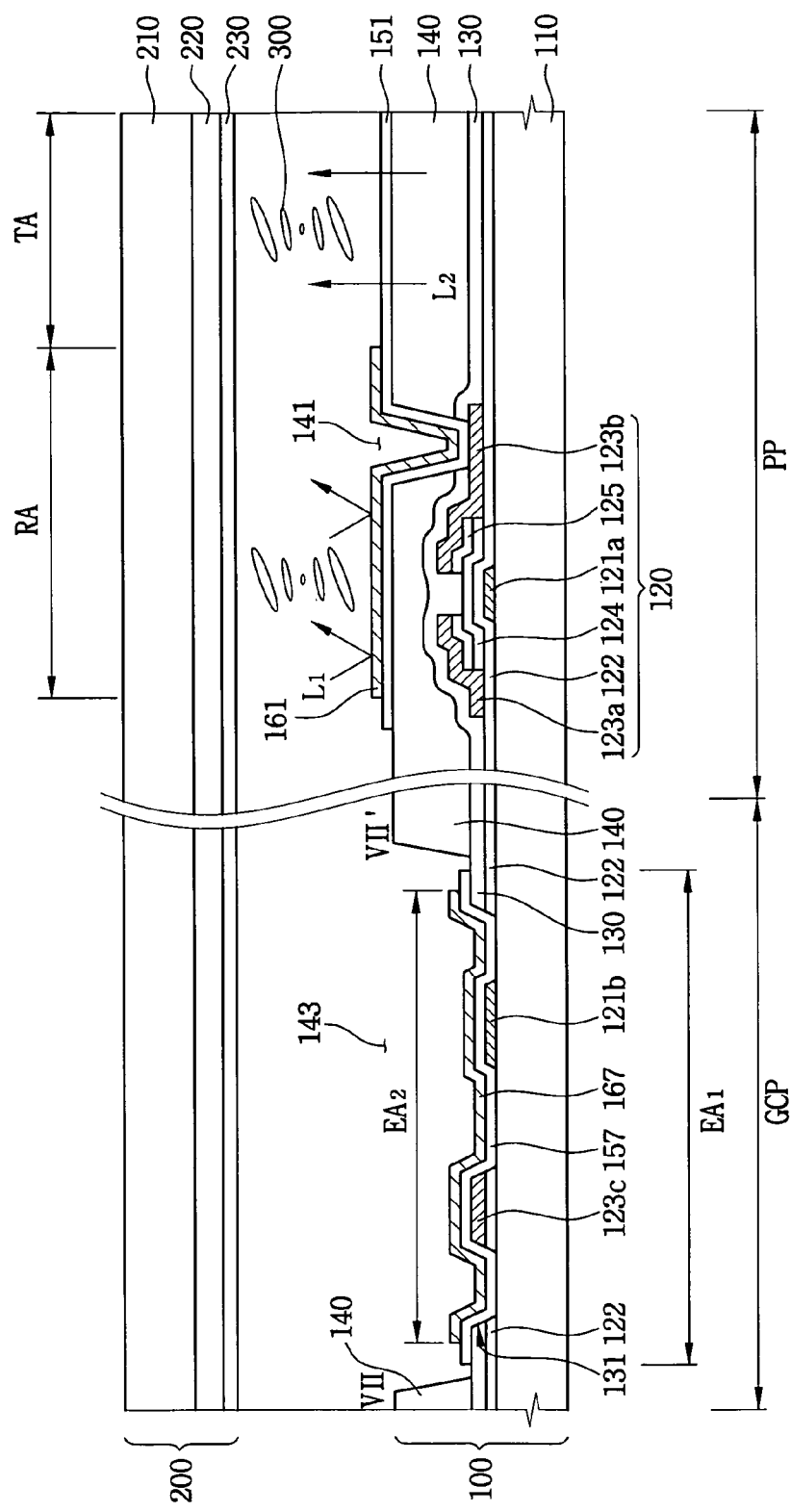
FIG. 13 is a cross-sectional view illustrating a reflective-transmissive LCD apparatus according to another exemplary embodiment of the present invention.
Figure 14:
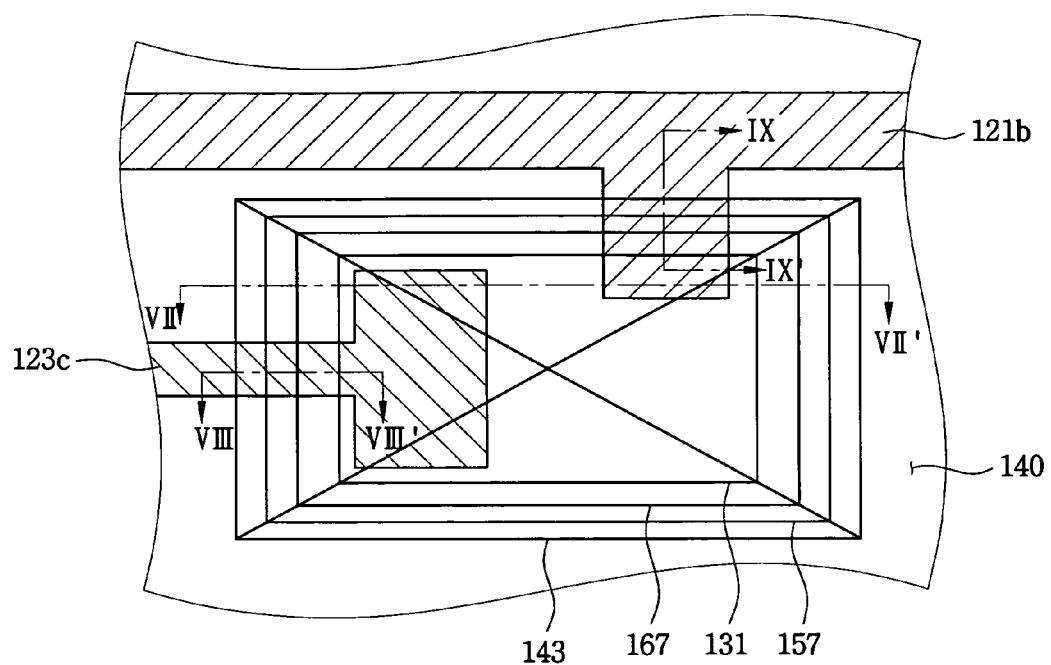
FIG. 14 is a plan view illustrating a gate circuit area according to another exemplary embodiment of the present invention.

FIG. 13 is a cross-sectional view illustrating a reflective-transmissive LCD apparatus according to another exemplary embodiment of the present invention. FIG. 14 is a plan view illustrating a gate circuit area according to another exemplary embodiment of the present invention. The reflective-transmissive LCD apparatus of FIGS. 13 and 14 is same as in FIGS. 1 to 3 except for a lower substrate. Thus, the same reference numerals will be used to refer to the same or like parts as those described in FIGS. 1 to 3 and any further explanation will be omitted.

Referring to FIGS. 13 and 14, an inorganic insulating layer 130 and an organic insulating layer 140 are formed in a pixel area PP and a gate circuit area GCP of a lower substrate 100.

The inorganic insulating layer 130 includes a seventh contact hole 131. A third data electrode 123c, a second gate electrode 121b and a first plate 110 are exposed through the seventh contact hole 131. Alternatively, the third data electrode 123c, a second gate electrode 121b and a first plate 110 may be partially exposed through the seventh contact hole 131. The organic insulating layer 140 includes an eighth contact hole 143 that is larger than the seventh contact hole 131. Therefore, the third data electrode 123c, the second gate electrode 121b, the first plate 110 and the inorganic insulating layer 130 are exposed through the eighth contact hole 143. Alternatively, the third data electrode 123c, the second gate electrode 121b, the first plate 110 and the inorganic insulating layer 130 may be partially exposed through the eighth contact hole 143. The exposed portion of the inorganic insulating layer 130 is adjacent to the seventh contact hole 131.

The seventh transmission electrode 157 is disposed on the exposed portion of the third data electrode 123c, the second gate electrode 121b and the inorganic insulating layer 130 so that the third data electrode 123c is electrically connected to the second gate electrode 121b.

A seventh reflection electrode 167 is disposed on the seventh transmission electrode 157 so that the seventh reflection electrode 167 is electrically connected to the third data electrode 123c and the second gate electrode 121b through the seventh transmission electrode 157. A second electrode region $EA_2$ corresponding to the seventh reflection electrode 167 is disposed in a first electrode region $EA_1$ corresponding to the seventh transmission electrode 157.

Figure 15A:
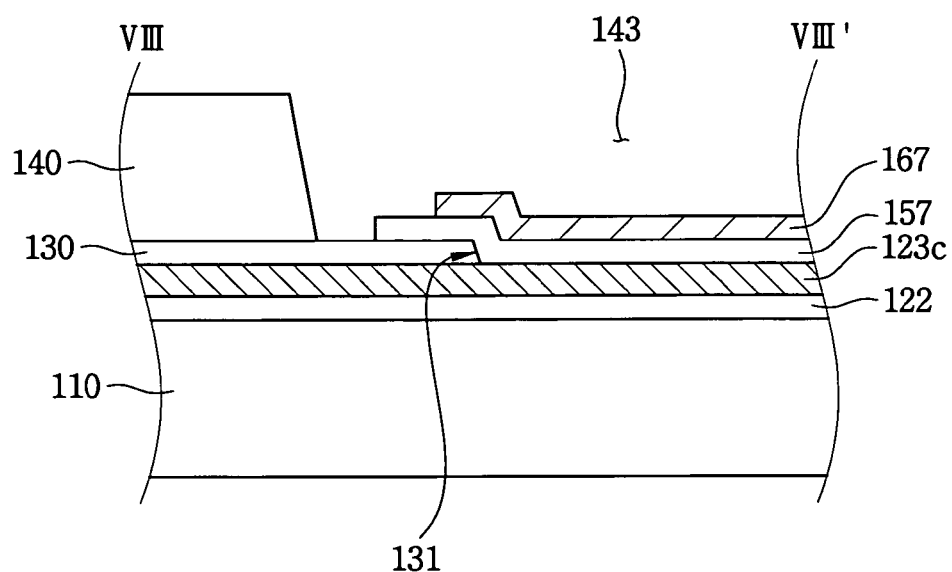
FIG. 15A is a cross-sectional view taken along the line VIII-VIII' of FIG. 14.
Figure 15B:
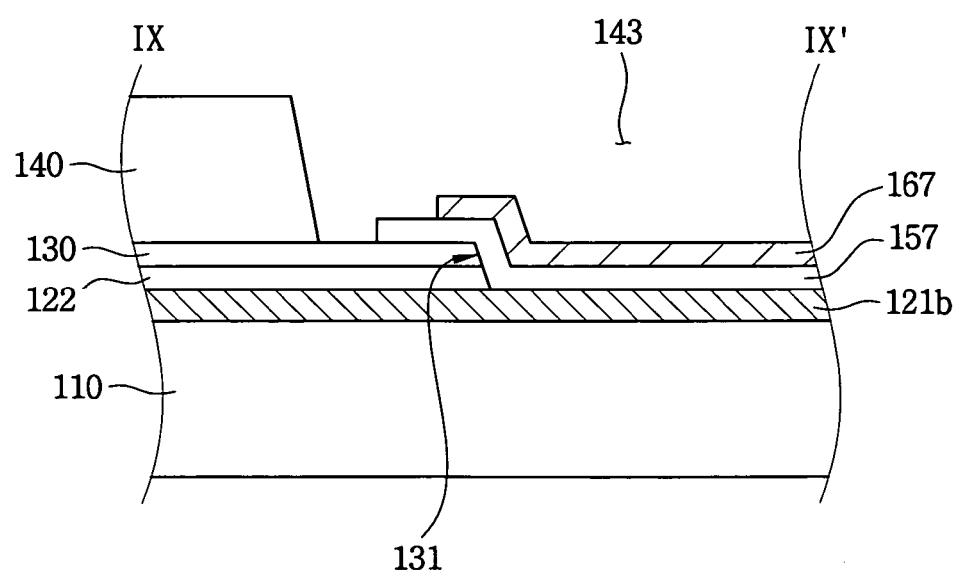
FIG. 15B is a cross-sectional view taken along the line IX-IX' of FIG. 14.

FIG. 15A is a cross-sectional view taken along the line VIII-VIII' of FIG. 14. FIG. 15B is a cross-sectional view taken along the line IX-IX' of FIG. 14.

Referring to FIGS. 15A and 15B, an end portion of the seventh transmission electrode 157 is disposed on the inorganic insulating layer 130 to cover the exposed portion of the third data electrode 123c and the second gate electrode 121b.

The seventh reflection electrode 167 is disposed on the seventh transmission electrode 157, and a portion of the seventh reflection electrode 167 corresponds to a portion of the inorganic insulating layer 130 having the end portion of the seventh transmission electrode 157 on the inorganic insulating layer 130. A second electrode region $EA_2$ corresponding to the seventh reflection electrode 167 is smaller than a first electrode region $EA_1$ corresponding to the seventh transmission electrode 157.

FIGS. 16A to 16D are cross-sectional views illustrating a method of manufacturing a lower substrate according to another exemplary embodiment of the present invention.

Figure 16A:
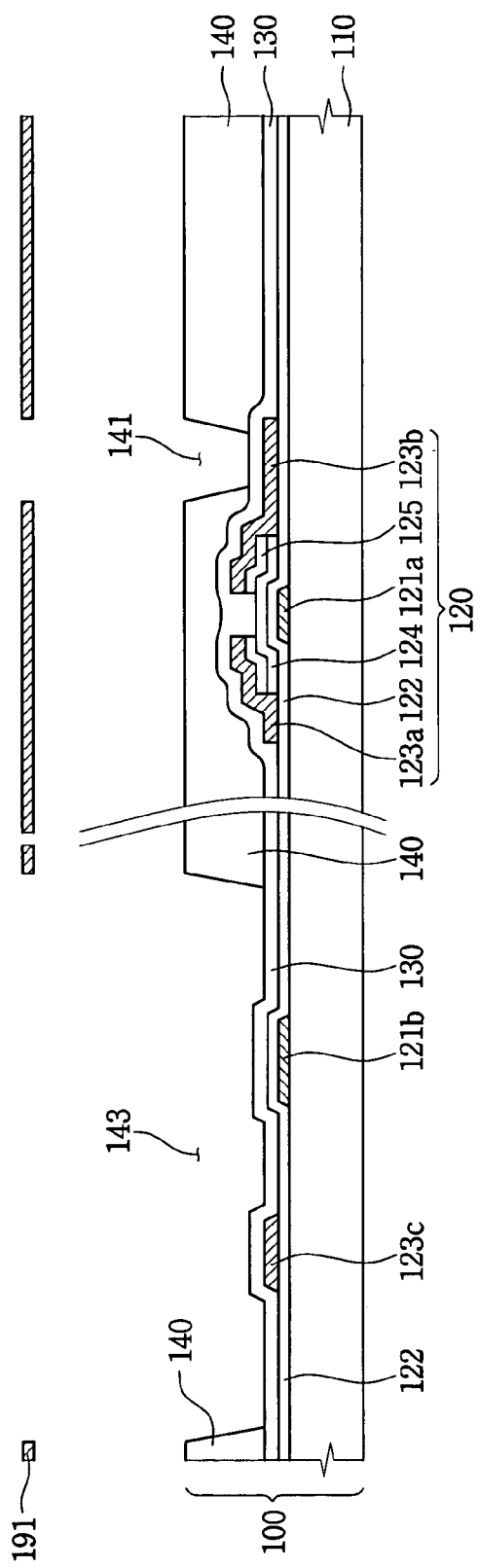
FIGS. 16A to 16D is cross-sectional views illustrating a method of manufacturing a lower substrate according to another exemplary embodiment of the present invention.

Referring to FIG. 16A, an organic insulating layer 140 including a photosensitive acryl resin is formed on the inorganic insulating layer 130. The organic insulating layer 140 is then patterned using a tenth mask 191 having a first transparent portion to form the eighth contact hole 143. The inorganic insulating layer 130 corresponding to the third data electrode 123*c* and the second gate electrode 121*b* is exposed through the eighth contact hole 143. Alternatively, the inorganic insulating layer 130 corresponding to the third data electrode 123*c* and the second gate electrode 121*b* may be partially exposed through the eighth contact hole 143.

Figure 16B:
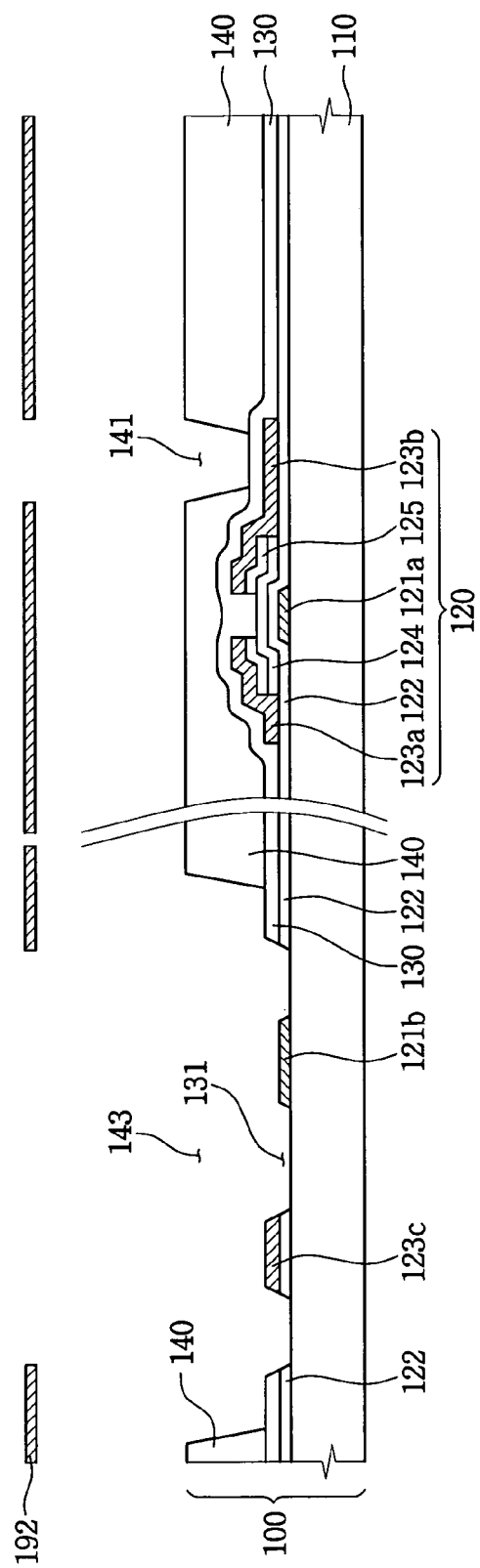

Referring to FIG. 16B, an eleventh mask 192 having a second transparent portion that is smaller than the first transparent portion is disposed over the exposed portion of the inorganic insulating layer 130 and the patterned organic insulating layer 140. The inorganic insulating layer 130 corresponding to the second transparent portion is removed using the eleventh mask 192 so that the third data electrode 123*c* and the second gate electrode 121*b* corresponding to the second transparent portion are exposed, whereas the exposed portion of the inorganic insulating layer 130 corresponding to the eighth contact hole 143 remains. Alternatively, the third data electrode 123*c* and the second gate electrode 121*b* corresponding to the second transparent portion may be partially exposed.

Figure 16C:
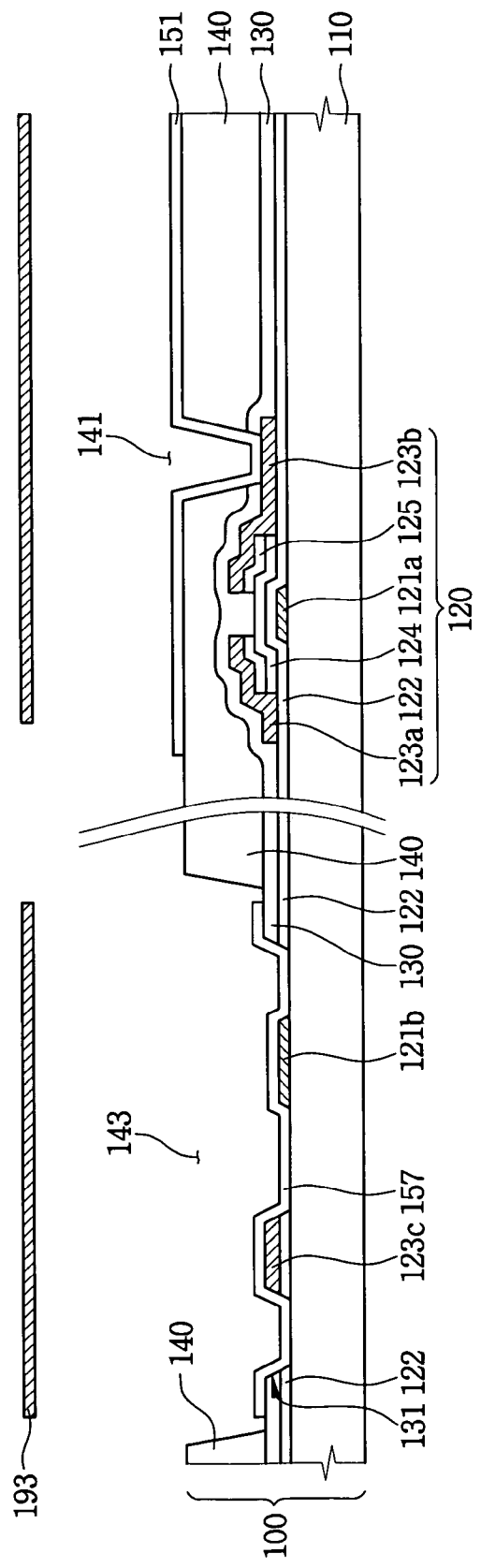
Figure 16D:
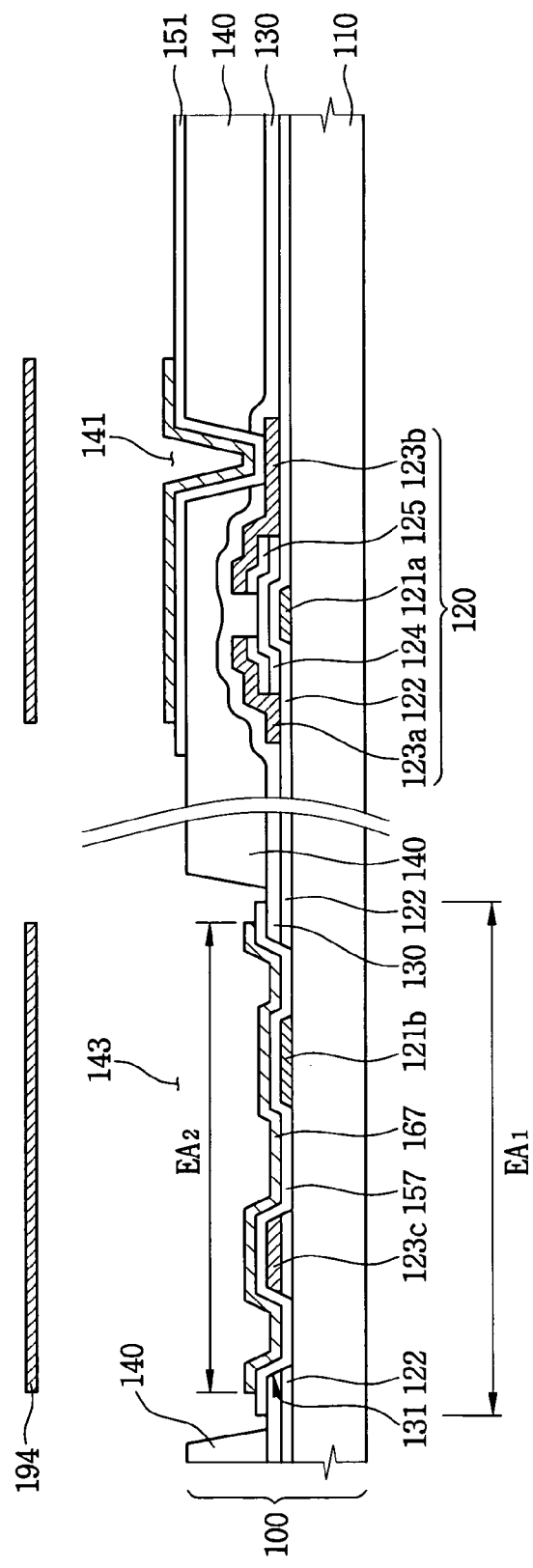

Referring to FIG. 16C, a first conductive layer (not shown) including ITO, IZO or ZO is formed over a lower substrate 100. The first conductive layer (not shown) is then patterned using a twelfth mask 193 so as to form the seventh transmission electrode 157 in the gate circuit area GCP.

The seventh transmission electrode 157 is electrically connected to the third data electrode 123*c* and the second gate electrode 121*b* through the eighth contact hole 143. The eighth contact hole 143 is disposed in a first electrode area $EA_1$ where the seventh transmission electrode 157 is formed so that an open circuit of the seventh transmission electrode 157 is prevented.

In addition, the end portion of the seventh transmission electrode 157 is disposed on the exposed portion of the inorganic insulating layer 130 that is exposed through the eighth contact hole 143. Therefore, the seventh transmission electrode 157 covers the exposed portion of the third data electrode 123*c* and the second gate electrode 121*b*, the exposed portion of the third data electrode 123*c* and the second gate electrode 121*b* being exposed through the eighth contact hole 143, whereas the seventh transmission electrode 157 is not disposed on the organic insulating layer 140.

Referring to FIG. 17D, a second conductive layer (not shown) including Al—Nd alloy is formed over the lower substrate 100. The second conductive layer (not shown) is then patterned using a thirteenth mask 194 to form the seventh reflection electrode 167 in the gate circuit area GCP.

The seventh reflection electrode 167 is electrically connected to the third data electrode 123*c* and the second gate electrode 121*b* through the seventh transmission electrode 157. A second electrode region $EA_2$ corresponding to the seventh reflection electrode 167 is disposed in a first electrode region $EA_1$ corresponding to the seventh transmission electrode 157, thereby preventing galvanic corrosion between the seventh transmission electrode 157 and the seventh reflection electrode 167.

According to the present invention, the organic insulating layer and the inorganic insulating layer of the lower substrate include the opening, through which the second gate electrode and the third data electrode are exposed, and the second transmission electrode is electrically connected to the second gate electrode and the third data electrode through the second reflection electrode.

Therefore, the open circuit of the conductive layer formed by the stepped portion between the organic insulating layer and the first plate may be prevented to improve the yield of the lower substrate and the display apparatus having the lower substrate.

The presently claimed invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A lower substrate comprising:
    a first signal electrode disposed in a circuit area, the circuit area disposed adjacent to a pixel area to drive the pixel area;
    a first insulating layer having an opening, through which the first signal electrode is exposed;
    a second signal electrode disposed on the first insulating layer in the circuit area, and spaced apart from the first signal electrode;
    a second insulating layer disposed on the first insulating layer, the second insulating layer including a contact hole, through which the first and second signal electrodes are exposed; and
    a conductive layer electrically connecting the first signal electrode to the second signal electrode.

2. The lower substrate of claim 1, wherein the first signal electrode is partially exposed through the opening of the first insulating layer, and the first and second signal electrodes are partially exposed through the contact hole.

3. The lower substrate of claim 1, wherein the conductive layer further comprises a transmission electrode including a transparent conductive material, and a reflection electrode disposed on the transmission electrode, and the reflection electrode includes a reflective material.

4. The lower substrate of claim 3, wherein the reflection electrode partially covers the transmission electrode.

5. The lower substrate of claim 1, wherein a portion of the conductive layer is disposed in the contact hole.

6. The lower substrate of claim 5, wherein an end portion of the conductive layer is disposed on the second insulating layer to cover the first and second signal electrodes that are partially exposed through the contact hole.

7. The lower substrate of claim 3, further comprising:
    a gate line disposed in the pixel area;
    a data line disposed in the pixel area;
    a thin film transistor disposed in the pixel area, the thin film transistor including a gate electrode electrically connected to the gate line, a source electrode electrically connected to the data line and a drain electrode spaced apart from the source electrode; and
    a pixel electrode disposed on the second insulating layer, and wherein the second insulating layer includes another opening, through which the drain electrode is electrically connected to the pixel electrode.

8. The lower substrate of claim 7, wherein the pixel electrode further comprises a transmission electrode including a transparent conductive material and a reflection electrode disposed on the transmission electrode, and the reflection electrode includes a reflective material.

9. The lower substrate of claim 1, wherein the second insulating layer comprises an inorganic insulating layer and an organic insulating layer disposed on the inorganic insulating layer.

10. A display apparatus comprising:
- a lower substrate including a first signal electrode disposed in a circuit area, the circuit area disposed adjacent to a pixel area to drive the pixel area, a first insulating layer having an opening, through which the first signal electrode is exposed, a second signal electrode disposed on the first insulating layer in the circuit area and spaced apart from the first signal electrode, a second insulating layer disposed on the first insulating layer to include a contact hole, through which the first and second signal electrodes are exposed, and a conductive layer electrically connecting the first signal electrode to the second signal electrode through the contact hole; and
- an upper substrate disposed above the lower substrate.

* * * * *